(12) United States Patent
Kim et al.

(10) Patent No.: US 10,374,087 B2
(45) Date of Patent: Aug. 6, 2019

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Dae-Won Kim, Seoul (KR); Jae-Kyu Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 211 days.

(21) Appl. No.: 14/956,908

(22) Filed: Dec. 2, 2015

(65) Prior Publication Data

US 2016/0163858 A1 Jun. 9, 2016

(30) Foreign Application Priority Data

Dec. 4, 2014 (KR) .................. 10-2014-0172738

(51) Int. Cl.
*H01L 29/78* (2006.01)
*H01L 29/66* (2006.01)
(Continued)

(52) U.S. Cl.
CPC ........ *H01L 29/7843* (2013.01); *H01L 27/228* (2013.01); *H01L 29/0696* (2013.01);
(Continued)

(58) Field of Classification Search
CPC ........... H01L 29/1037; H01L 29/42356; H01L 29/42336; H01L 29/4236; H01L 29/7397;
(Continued)

(56) References Cited

U.S. PATENT DOCUMENTS 7,915,121 B1 * 3/2011 Kim .................. H01L 27/10894
257/E21.384
8,159,009 B2 4/2012 Yang
(Continued)

FOREIGN PATENT DOCUMENTS

JP 2013-062381 A 4/2013
JP 2013-065590 A 4/2013
(Continued)

*Primary Examiner* — Davienne N Monbleau
*Assistant Examiner* — Leslie Pilar Cruz
(74) *Attorney, Agent, or Firm* — Harness, Dickey & Pierce, P.L.C.

(57) ABSTRACT

A semiconductor device includes a substrate, first and second isolation layers, an insulation layer pattern, and a gate structure. The substrate has a cell region and a peripheral region. The first isolation layer is buried in a first upper portion of the substrate in the peripheral region. The second isolation layer is buried in a second upper portion of the substrate in the cell region, and extends along a first direction substantially parallel to a top surface of the substrate. The insulation layer pattern is buried in the first upper portion, and extends along a second direction substantially parallel to the top surface of the substrate and substantially perpendicular to the first direction. The insulation layer pattern has a lower surface higher than a lower surface of the second isolation layer, and applies a stress to a portion of the substrate adjacent thereto.

2 Claims, 42 Drawing Sheets

(51) Int. Cl.
*H01L 29/06* (2006.01)
*H01L 27/22* (2006.01)
*H01L 21/762* (2006.01)

(52) U.S. Cl.
CPC .... *H01L 29/66734* (2013.01); *H01L 29/7813* (2013.01); *H01L 21/76224* (2013.01); *H01L 21/76229* (2013.01); *H01L 21/76232* (2013.01)

(58) Field of Classification Search
CPC ......... H01L 21/76205; H01L 21/76229; H01L 21/76232; H01L 21/76235; H01L 21/76283; H01L 29/7843; H01L 29/7813; H01L 29/66734; H01L 29/0696; H01L 27/108
See application file for complete search history.

(56) References Cited

U.S. PATENT DOCUMENTS

| | | | |
|---|---|---|---|
| 8,298,892 B1 | 10/2012 | Lee et al. | |
| 8,779,423 B2 | 7/2014 | Liu et al. | |
| 2005/0287731 A1* | 12/2005 | Bian | H01L 27/11517 438/201 |
| 2006/0264003 A1* | 11/2006 | Eun | H01L 21/76229 438/424 |
| 2007/0037345 A1 | 2/2007 | Manger | |
| 2008/0157191 A1* | 7/2008 | Choi | H01L 29/045 257/330 |
| 2009/0283852 A1* | 11/2009 | Gutmann | H01L 21/76232 257/510 |
| 2011/0024822 A1* | 2/2011 | Sandhu | H01L 21/76229 257/321 |
| 2013/0146968 A1 | 6/2013 | Kim | |
| 2013/0302968 A1 | 11/2013 | Lin et al. | |

FOREIGN PATENT DOCUMENTS

| | | |
|---|---|---|
| JP | 2013-219179 A | 10/2013 |
| KR | 100866141 B1 | 10/2008 |
| KR | 2008-0112659 A | 12/2008 |
| KR | 101026479 B1 | 4/2011 |

* cited by examiner

FIG. 1
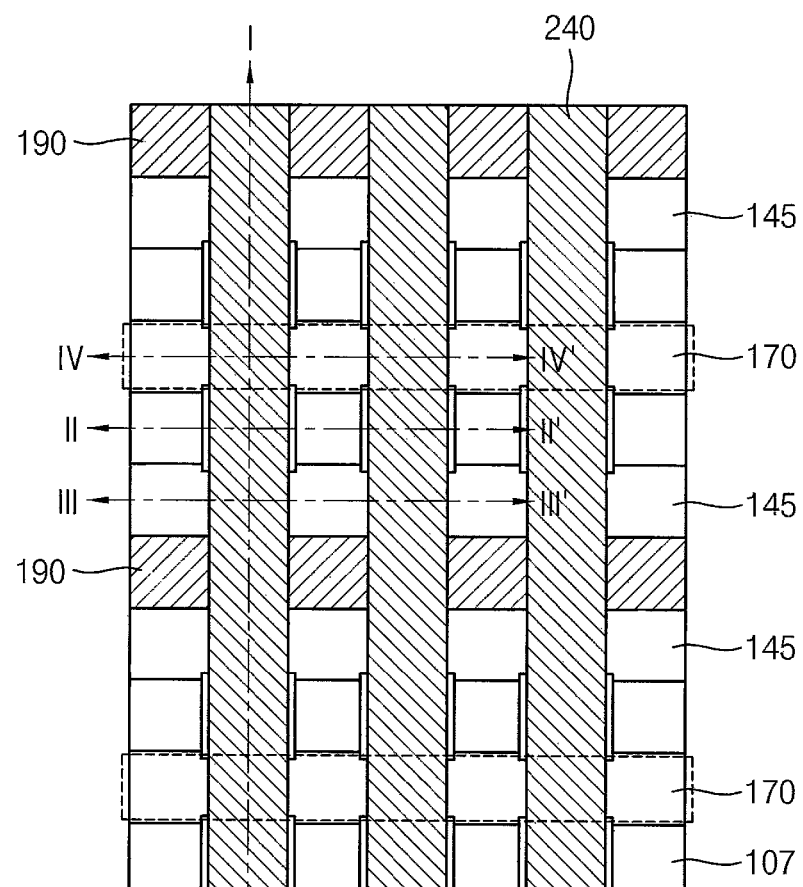
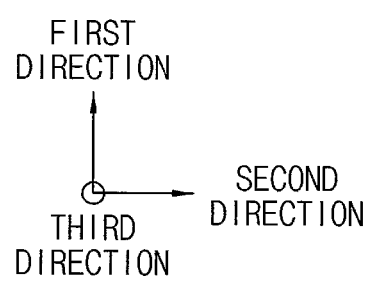

US 10,374,087 B2

SEMICONDUCTOR DEVICES AND METHODS OF MANUFACTURING THE SAME

CROSS-REFERENCE TO RELATED APPLICATION

This application claims the benefit of priority under 35 USC § 119 to Korean Patent Application No. 10-2014-0172738, filed on Dec. 4, 2014 in the Korean Intellectual Property Office (KIPO), the contents of which are herein incorporated by reference in their entirety.

BACKGROUND

1. Field

Example embodiments relate to semiconductor devices and/or methods of manufacturing the same. More particularly, example embodiments relate to semiconductor devices having a buried gate structure and/or methods of manufacturing the same.

2. Description of the Related Art

As semiconductor devices such as magnetic random access memory (MRAM) devices become even more highly-integrated and with larger capacity, electric characteristics of the semiconductor devices may deteriorate. Particularly, as a channel length becomes shorter, a gate induced drain leakage (GIDL) may be generated due to a short channel effect of a thin film transistor (TFT).

Accordingly, a semiconductor device having an increased channel length by forming a buried gate structure has been studied.

SUMMARY

Example embodiments relate to semiconductor devices and/or methods of manufacturing the same. More particularly, example embodiments relate to semiconductor devices having a buried gate structure and/or methods of manufacturing the same.

Example embodiments provide a semiconductor device having improved electrical characteristics.

Example embodiments provide a method of manufacturing a semiconductor device having improved electrical characteristics.

According to some example embodiments, there is a provided a semiconductor device. The semiconductor device includes a substrate, first and second isolation layers, an insulation layer pattern, and a gate structure. The substrate has a cell region and a peripheral region. The first isolation layer is buried in a first upper portion of the substrate, the first upper portion being in the peripheral region. The second isolation layer is buried in a second upper portion of the substrate, the second upper portion being in the cell region. The second isolation layer extends along a first direction substantially parallel to a top surface of the substrate. The insulation layer pattern is buried in the second upper portion, and extends along a second direction, the second direction being substantially parallel to the top surface of the substrate and substantially perpendicular to the first direction. The insulation layer pattern has a lower surface higher than a lower surface of the second isolation layer, and applies a stress to a portion of the substrate adjacent thereto.

In some example embodiments, the gate structure may extend along the second direction in the second upper portion, and the gate structure may include a gate insulation layer on a bottom and a sidewall of a gate trench, a gate electrode on the gate insulation layer, the gate electrode filling a lower portion of the gate trench, and a gate mask on the gate electrode, the gate mask filling an upper portion of the gate trench.

In some example embodiments, a width of a bottom portion of the insulation layer pattern may be greater than a width of a top portion of the insulation layer pattern, and the width of the top portion of the insulation layer pattern may be less than a width of a top of the gate trench.

In some example embodiments, a width of the insulation layer pattern may gradually decrease from a top portion toward a bottom portion thereof, and a width of the top portion of the insulation layer pattern may be less than that of a top of the gate trench.

In some example embodiments, the insulation layer pattern may include a plurality of auxiliary insulation layer patterns arranged along the first direction, and the gate structure may include a plurality of gate structures arranged along the first direction. A pair of gate electrodes may be between a respective pair of the auxiliary insulation layer patterns adjacent to each other along the first direction.

In some example embodiments, the semiconductor device may further include a lower electrode electrically connected to the gate structure, an MTJ structure on the lower electrode, and an upper electrode on the MTJ structure.

In some example embodiments, the insulation layer pattern may insulate upper portions of the substrate, the upper portions being spaced apart from each other in the first direction.

In some example embodiments, a depth of the insulation layer pattern may be greater than a depth of the gate trench.

In some example embodiments, a ratio of the depth of the insulation layer pattern to the depth of the gate trench may be in a range of between about 1:1.01 to about 1:1.2.

In some example embodiments, the insulation layer pattern may include silicon nitride, and may apply a tensile stress to the portion of the substrate adjacent thereto.

In some example embodiments, a width of the insulation layer pattern may gradually decrease from a top portion toward a bottom portion thereof.

In some example embodiments, a width of a bottom portion of the insulation layer pattern may be greater than a width of a top portion of the insulation layer pattern.

According to some example embodiments, there is a provided a method of manufacturing a semiconductor device. In the method, a first isolation layer is formed in an upper portion of a substrate in a peripheral region, and the substrate has a cell region and the peripheral region. A second isolation layer is formed in an upper portion of the substrate in the cell region. The substrate and the second isolation layer in the cell region are partially removed to form a plurality of gate trenches. A gate electrode and a sacrificial gate electrode are formed to fill the gate trenches. The sacrificial gate electrode is removed to expose first gate trenches of the gate trenches. Portions of the substrate under a respective one of the first gate trenches are removed to form recesses. Each of the recesses has a bottom lower than a bottom of each of the gate trenches and higher than a bottom portion of the second isolation layer. An insulation layer pattern is formed to fill each of the recesses.

In some example embodiments, the forming a second isolation layer may include forming a plurality of second isolation layers each extending along a first direction substantially parallel to a top surface of the substrate. The forming a plurality of gate trenches may include forming the gate trenches each extending along a second direction substantially parallel to the top surface of the substrate and substantially perpendicular to the first direction.

In some example embodiments, the removing portions of the substrate under a respective one of the first gate trenches includes performing a dry etch process. A width of the recess may gradually decrease from a top toward a bottom thereof.

In some example embodiments, the removing portions of the substrate under a respective one of the first gate trenches includes performing a wet etch process. A width of a bottom of the recess may be greater than a width of a top of the recess.

In some example embodiments, the removing portions of the substrate under a respective one of the first gate trenches includes discharging an etching gas to form a plasma, and applying a bias voltage to accelerate ions in the plasma toward the substrate.

In some example embodiments, the first and second isolation layers may be simultaneously formed.

In some example embodiments, when the insulation layer pattern is formed, silicon nitride may be deposited by an HDP-CVD process.

In some example embodiments, when the insulation layer pattern is formed, silicon nitride may be deposited by a chemical vapor deposition (CVD) process, an atomic layer deposition (ALD) process, or a process combining characteristics of the CVD and ALD processes.

According to some example embodiments, the semiconductor device may include the first isolation layer in the peripheral region, and the second isolation layer and the insulation layer pattern in the cell region. The second isolation layer may extend in the first direction, and the insulation layer pattern may have a bottom portion higher than a bottom portion of the second isolation layer, and may extend in the second direction substantially perpendicular to the first direction. The insulation layer pattern may insulate the active patterns spaced apart from each other in the first direction. The insulation layer pattern may apply a stress to a portion of the substrate adjacent thereto, and thus the electrical characteristics of the semiconductor device may be enhanced.

According to some example embodiments, a semiconductor device includes an isolation layer buried in an upper portion of a substrate, the upper portion being in a cell region of the substrate, and the isolation layer extending in a first direction substantially parallel to a top surface of the substrate, and an insulation layer pattern buried in the upper portion, the insulation layer pattern extending along a second direction, and the second direction being substantially perpendicular to the first direction. A lowermost surface of the insulation layer pattern is higher than a lowermost surface of the isolation layer. The semiconductor device further includes a gate structure on the substrate in the cell region, the insulation layer pattern applying a stress to a channel region of the gate structure.

Lateral sides of the insulation layer pattern may be inclined.

A top portion of the insulation layer pattern may have a first width extending in the first direction, and a bottom portion of the insulation layer pattern may have a second width extending in the first direction, the first width being greater than the second width.

The bottom portion of the insulation layer pattern may have a third width extending in the first direction, the third width being greater than the first width.

The bottom portion of the insulation layer pattern may have a rounded shape or an angular shape.

BRIEF DESCRIPTION OF THE DRAWINGS

Example embodiments will be more clearly understood from the following detailed description taken in conjunction with the accompanying drawings. FIGS. 1 to 40 represent non-limiting, example embodiments as described herein.

FIGS. 1 to 3 are a plan view and cross-sectional views illustrating a semiconductor device in accordance with some example embodiments;

FIG. 4 is a cross-sectional view illustrating a semiconductor device in accordance with some example embodiments;

FIG. 5 is a cross-sectional view illustrating a semiconductor device in accordance with some example embodiments;

FIG. 6 is a cross-sectional view illustrating a semiconductor device in accordance with some example embodiments;

FIG. 7 is a cross-sectional view illustrating a semiconductor device in accordance with some example embodiments;

FIGS. 8 to 35 are plan views and cross-sectional views illustrating steps of a method of manufacturing a semiconductor device;

FIGS. 36 to 39 are cross-sectional views illustrating steps of a method of manufacturing a semiconductor device; and FIG. 40 is a block diagram illustrating a schematic configuration of an information processing system in accordance with some example embodiments.

DESCRIPTION OF EXAMPLE EMBODIMENTS

Figure 2:
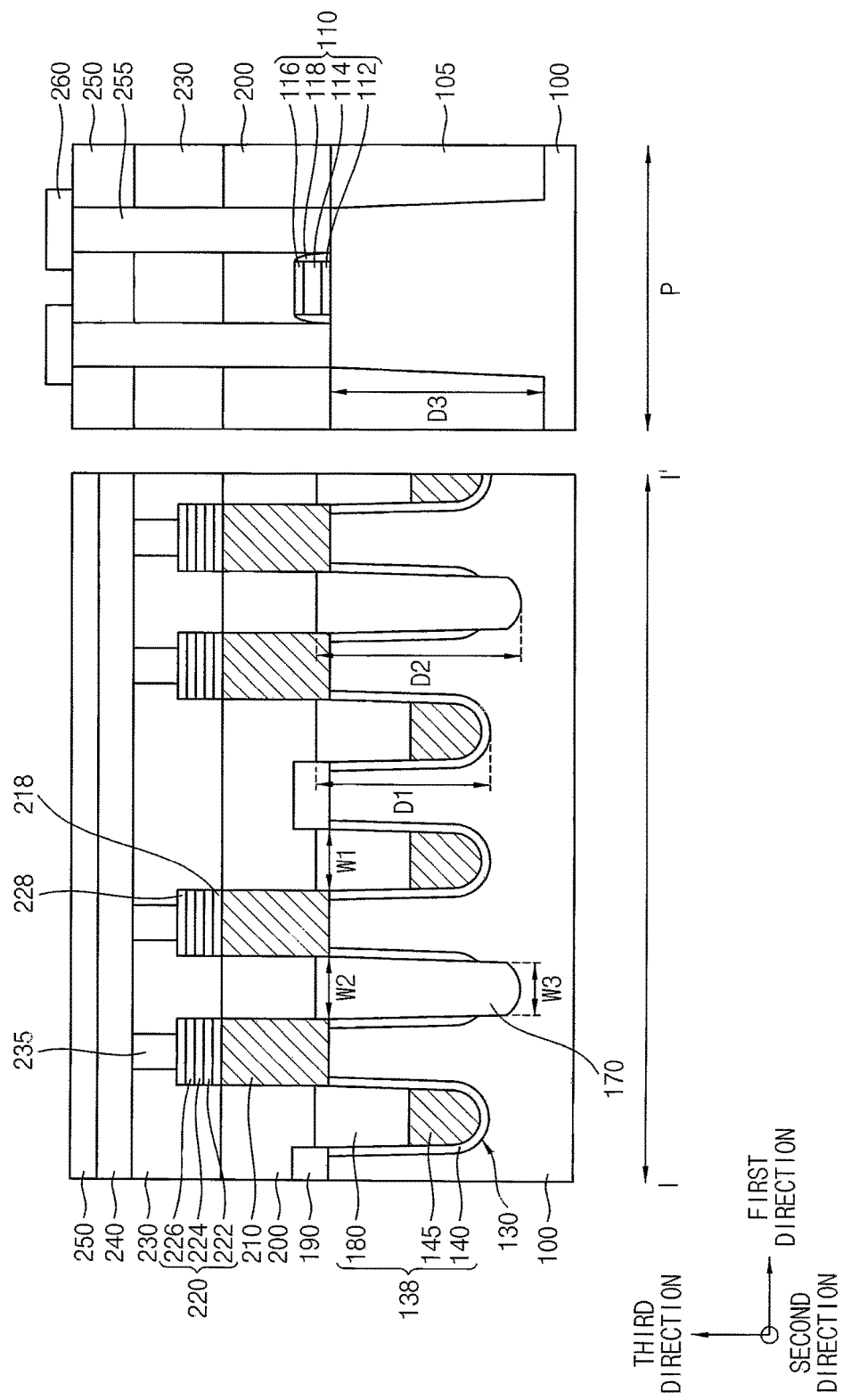

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being various elements, these elements should not be limited by these terms. These terms are only used to distinguish one element from another. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Example embodiments relate to semiconductor devices and/or methods of manufacturing the same. More particularly, example embodiments relate to semiconductor devices having a buried gate structure and/or methods of manufacturing the same.

Figure 3:
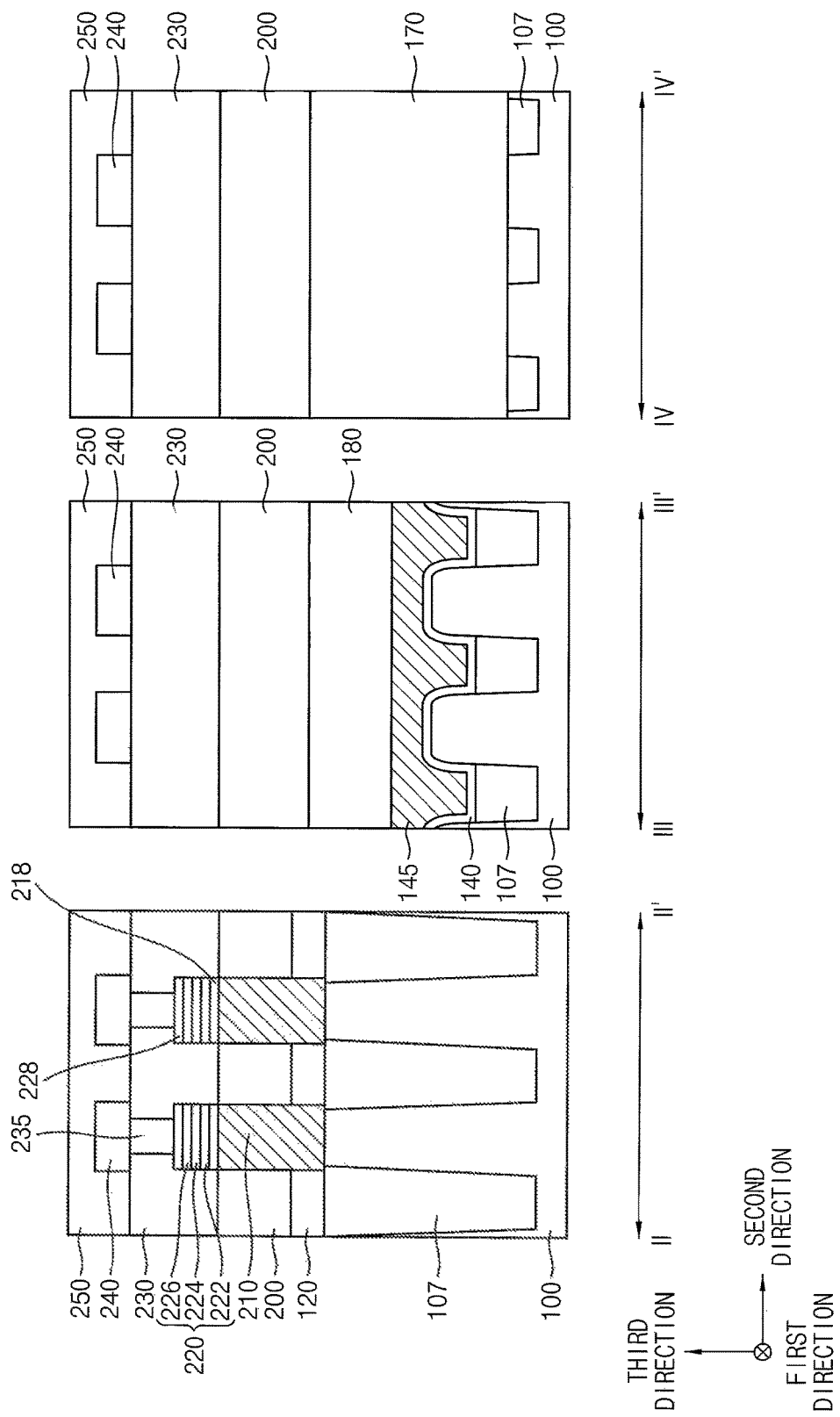

FIGS. 1 to 3 are a plan view and cross-sectional views illustrating a semiconductor device in accordance with some example embodiments.

Particularly, FIG. 1 is a plan view illustrating a cell region of the semiconductor device, FIG. 2 illustrates cross-sectional views of the cell region of the semiconductor device taken along a line I-I' in FIG. 1 and a peripheral region of the semiconductor device, and FIG. 3 illustrates cross-sectional views of the cell region of the semiconductor device taken along lines II-II', III-III', and IV-IV', respectively.

Referring to FIGS. 1-3, a semiconductor device may include isolation layers 105 and 107, an insulation layer pattern 170, gate structures 138, a magnetic tunnel junction (MTJ) structure 220, a source line 190, and a bit line 240 on a substrate 100.

The substrate 100 may include silicon, germanium, silicon-germanium, and/or III-IV compound semiconductor, e.g., GaP, GaAs, GaSb, or the like. In some example embodiments, a silicon-on-insulator (SOI) substrate or a germanium-on-insulator (GOI) substrate may be used as the substrate 100.

In some example embodiments, the substrate 100 may include a cell region in which memory cells of the semiconductor device may be formed, and a peripheral region P in which peripheral circuits may be formed. Hereinafter, each of the cell region and the peripheral region P may be defined to include not only a portion of the substrate 100 but also a space over and/or under the portion of the substrate 100 vertically overlapping thereto. The isolation layers 105 and 107 may be buried in upper portions of the substrate 100. As illustrated in FIGS. 1 and 2, the first isolation layer 105 may be buried in an upper portion of the substrate 100 in the peripheral region P, and the second isolation layer 107 may be buried in an upper portion of the substrate 100 in the cell region.

In some example embodiments, the first and second isolation layers 105 and 107 may have substantially the same depth, e.g., a third depth D3, and may include substantially the same material. Alternatively, the first isolation layer 105 and the second isolation layer 107 may have different depths from each other, and in this case, only the first isolation layer 105 may have the third depth D3.

Figure 8:
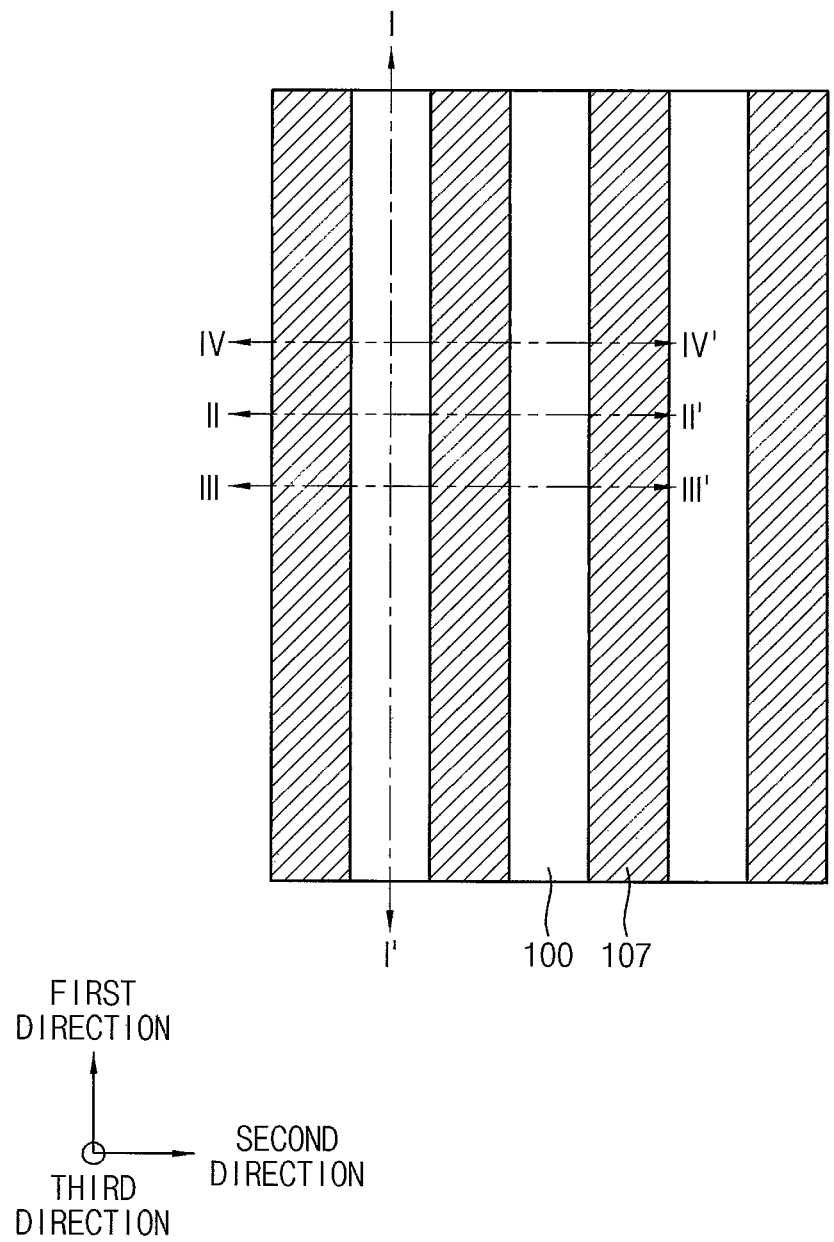

As illustrated in FIG. 1 and FIG. 8 that may be referred to later, a plurality of second isolation layers 107 may be arranged along a second direction. Each of the second isolation layers 107 may extend along a first direction substantially perpendicular to the second direction. An upper portion of the substrate 100 in the cell region on which no isolation layer is formed may be defined as an active pattern.

The isolation layers 105 and 107 may include an insulation material, e.g., silicon oxide.

The insulation layer pattern 170 may extend along the second direction through the active patterns of the substrate 100 and upper portions of the second isolation layers 107. In some example embodiments, a plurality of insulation layer patterns 170 may be arranged along the first direction. For example, as illustrated in FIG. 1, a pair of gate electrodes 145 may be disposed between neighboring insulation layer patterns 170 in the first direction.

The insulation layer pattern 170 may include an insulation material capable of (or, alternatively, configured for) applying a stress on an upper portion of the substrate 100 adjacent thereto. The insulation layer pattern 170 may insulate the active patterns spaced apart from each other in the first direction.

In some example embodiments, the insulation layer pattern 170 may be formed by a deposition process, e.g., a chemical vapor deposition (CVD) process, a high density plasma chemical vapor deposition (HDP-CVD) process, an atomic layer deposition (ALD) process, or a process combining characteristics of the CVD, HDP-CVD and/or ALD processes. In the deposition process, an insulation material, e.g., silicon oxide, silicon nitride, or the like, may be deposited.

For example, when the insulation layer pattern 170 is formed to include silicon oxide by an ALD process, the insulation layer pattern 170 may have a stress of about −0.3 GPa, and apply a tensile stress to the neighboring upper portion of the substrate 100.

Alternatively, when the insulation layer pattern 170 is formed to include silicon nitride by an HDP-CVD process, the insulation layer pattern 170 may have a stress of about −1.8 GPa, and apply a tensile stress to the neighboring upper portion of the substrate 100.

When the insulation layer pattern 170 is formed to include silicon nitride by a process combining characteristics of an ALD process and a CVD process, the insulation layer pattern 170 may apply a tensile stress to the neighboring upper portion of the substrate 100, which may be greater than those formed by the above-mentioned processes.

The insulation layer pattern 170 may have a second depth D2. In some example embodiments, the second depth D2 may be less than the third depth D3 of the first and second isolation layers 105 and 107. A top portion of the insulation layer pattern 170 may have a second width W2 in the first direction, and a bottom portion of the insulation layer pattern 170 may have a third width W3 in the first direction. In some example embodiments, a width of the insulation layer pattern 170 may gradually decrease from the top portion toward the bottom portion thereof, and thus the second width W2 may be greater than the third width W3.

Referring again to FIG. 2, the gate structure 138 may extend along the second direction through the active patterns and upper portions of the second isolation layers 107. The gate structure 138 may be buried in the active pattern that may be an upper portion of the substrate 100. For example, the gate structure 138 may fill a gate trench 130 in the upper portion of the substrate 100.

The gate structure 138 may include a gate insulation layer 140, a gate electrode 145, and a gate mask 180. The gate insulation layer 140 may be disposed on a bottom and a sidewall of the gate trench 130. The gate electrode 145 may be disposed on the gate insulation layer 140 to fill a lower portion of the gate trench 130. The gate mask 180 may be disposed on the gate electrode 145 to fill an upper portion of the gate trench 130.

The gate insulation layer 140 may include an oxide, e.g., silicon oxide, a metal oxide, or the like. The gate electrode 140 may include a metal, e.g., tantalum, aluminum, tungsten, or the like, or a metal nitride, e.g., titanium nitride, tantalum nitride, tungsten nitride, or the like. The gate mask 180 may include a nitride, e.g., silicon nitride.

A top of the gate trench 130 may have a first width W1 in the first direction. In some example embodiments, the first width W1 of the gate trench 130 may be substantially the same as the second width W2 of the top portion of the insulation layer pattern 170.

The gate trench 130 may have a first depth D1. In some example embodiments, the first depth D1 of the gate trench 130 may be less than the second depth D2 of the insulation layer pattern 170.

In some example embodiments, a ratio of the second depth D2 to the first depth D1 may be in a range of about 1:1 to about 1.5:1, or in a range of about 1.01:1 to about 1.2:1.

Because the depth of the insulation layer pattern 170 may be greater than that of the gate trench 130, the insulation layer pattern 170 may effectively apply a stress to a portion of the substrate 100 adjacent to the gate trench 130. As the depth of the insulation layer pattern 170 increases, more stress may be applied to the portion of the substrate 100 adjacent to the gate trench 130. According to simulation results, however, when the depth of the insulation layer pattern 170 is more than about 1.2 times of the depth of the gate trench 130, an amount of the stress applied to the portion of the substrate 100 may be saturated.

The source line 190 may be disposed on a portion of the substrate 100 between a pair of gate electrodes 145 disposed in the first direction. As illustrated in FIG. 1, the source line 190 may extend along the second direction. The source line 190 may provide a source current for a transistor having a pair of gate electrodes 145 adjacent to each other.

A first insulating interlayer 200 may cover the source line 190. A first contact 210 may be formed through the first insulating interlayer 200, and may contact an upper portion of the substrate 100 on which no source line is formed.

A lower electrode 218, the MTJ structure 220, and an upper electrode 228 may be sequentially stacked on the first insulating interlayer 200.

The MTJ structure 220 may include a fixed layer 222, a tunnel barrier layer 224 and a free layer 226 sequentially stacked. The fixed layer 222 of the MTJ structure 220 may have a fixed magnetization direction. The free layer 226 of the MTJ structure 220 may have a magnetization direction that may be changed to be parallel or anti-parallel to the magnetization direction of the fixed layer 222. Each of the fixed layer 222 and the free layer 226 may include a magnetic material. The tunnel barrier layer 224 may include at least one of magnesium oxide, titanium oxide, aluminum oxide, magnesium zinc oxide, and magnesium boron oxide. The lower electrode 218 and the upper electrode 228 may include a conductive metal nitride, e.g., titanium nitride, tantalum nitride, tungsten nitride, or the like.

A second insulating interlayer 230 may cover the lower electrode 218, the MTJ structure 220, and the upper electrode 228. A second contact 235 may be formed through the second insulating interlayer 230, and may contact the upper electrode 228.

The bit line 240 may be disposed on the second insulating interlayer 230, and may be electrically connected to the second contact 235. The bit line 240 may extend along the first direction. In some example embodiments, a plurality of bit lines 240 may be arranged along the second direction.

A peripheral gate structure 110 may be disposed on the substrate 100 in the peripheral region P. The peripheral gate structure 110 may include a peripheral gate insulation layer 112, a peripheral gate electrode 114, and a peripheral gate mask 116 sequentially stacked on the substrate 100. The peripheral gate structure 110 may further include a gate spacer 118 disposed on sidewalls of the peripheral gate insulation layer 112, the peripheral gate electrode 114, and the peripheral gate mask 116.

The first to third insulating interlayers 200, 230, and 250 may be sequentially stacked in the peripheral region P, and the first insulating interlayer 200 may cover the peripheral gate structure 110. A third contact 255 may be formed through the first to third insulating interlayers 200, 230 and 250, and may contact the substrate 100 and/or the peripheral gate structure 110. A wiring 260 may be disposed on the third insulating interlayer 250 to be electrically connected to the third contact 255.

The semiconductor device may include the first isolation layer 105 in the peripheral region P and the second isolation layer 107 in the cell region on the substrate 100. The second isolation layer 107 may extend along the first direction. The insulation layer pattern 170 may have a lower surface higher than that of the second isolation layer 107, and extend along the second direction substantially perpendicular to the first direction. The insulation layer pattern 170 may insulate the active patterns spaced apart from each other in the first direction. Additionally, the insulation layer pattern 170 may apply a stress to the neighboring active patterns, and thus electrical characteristics of the semiconductor device may be improved.

Figure 4:
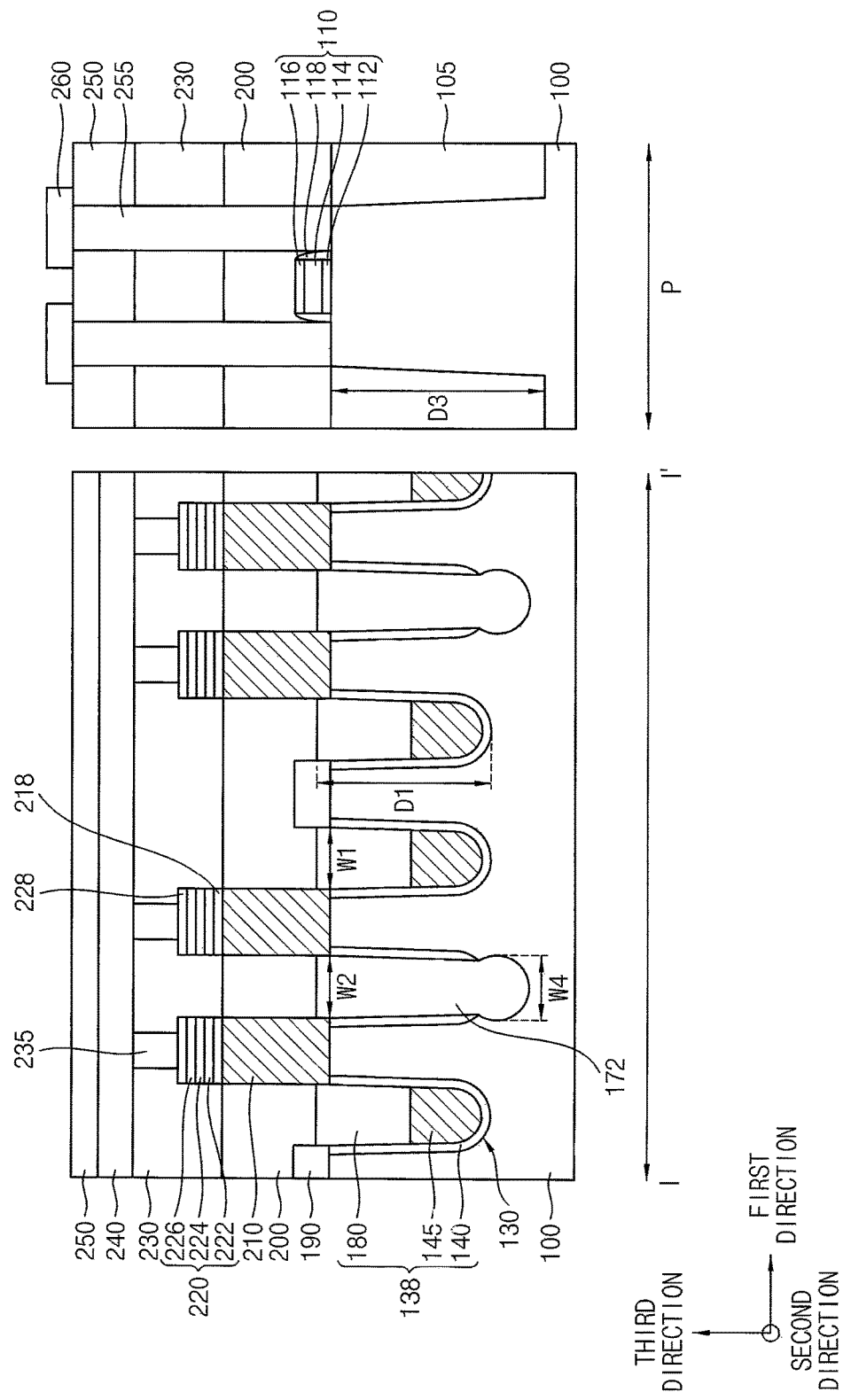

FIG. 4 is a cross-sectional view illustrating a semiconductor device in accordance with some example embodiments. The semiconductor device may be substantially the same as or similar to that illustrated with reference to FIGS. 1 to 3 except for the insulation layer pattern.

Referring to FIG. 4, a semiconductor device may include the first and second isolation layers 105 and 107, an insulation layer pattern 172, the gate structure 138, the MTJ structure 220, the source line 190, and the bit line 240 on the substrate 100.

The insulation layer pattern 172 may extend along the second direction through the active patterns and upper portions of the second isolation layer 107. The insulation layer pattern 172 may include an insulation material capable of (or, alternatively, configured for) applying a stress on an upper portion of the substrate 100 adjacent thereto. The insulation layer pattern 172 may insulate the active patterns spaced apart from each other in the first direction.

A top portion of the insulation layer pattern 172 may have the second width W2 in the first direction, and a bottom portion of the insulation layer pattern 172 may have a fourth width W4 in the first direction. In some example embodiments, the fourth width W4 may be greater than the second width W2. A lower portion of the insulation layer pattern 172 may fill a recess formed by an etching process that will be illustrated with reference to FIG. 22B later. Accordingly, the lower portion of the insulation layer pattern 172 may have a rounded shape.

In some example embodiments, as the width of the bottom portion of the insulation layer pattern 172 increases, the insulation layer pattern 172 may efficiently apply a stress to a portion of the substrate 100 adjacent to the gate electrode 145. Accordingly, the mobility of electric charges may be increased.

Figure 5:
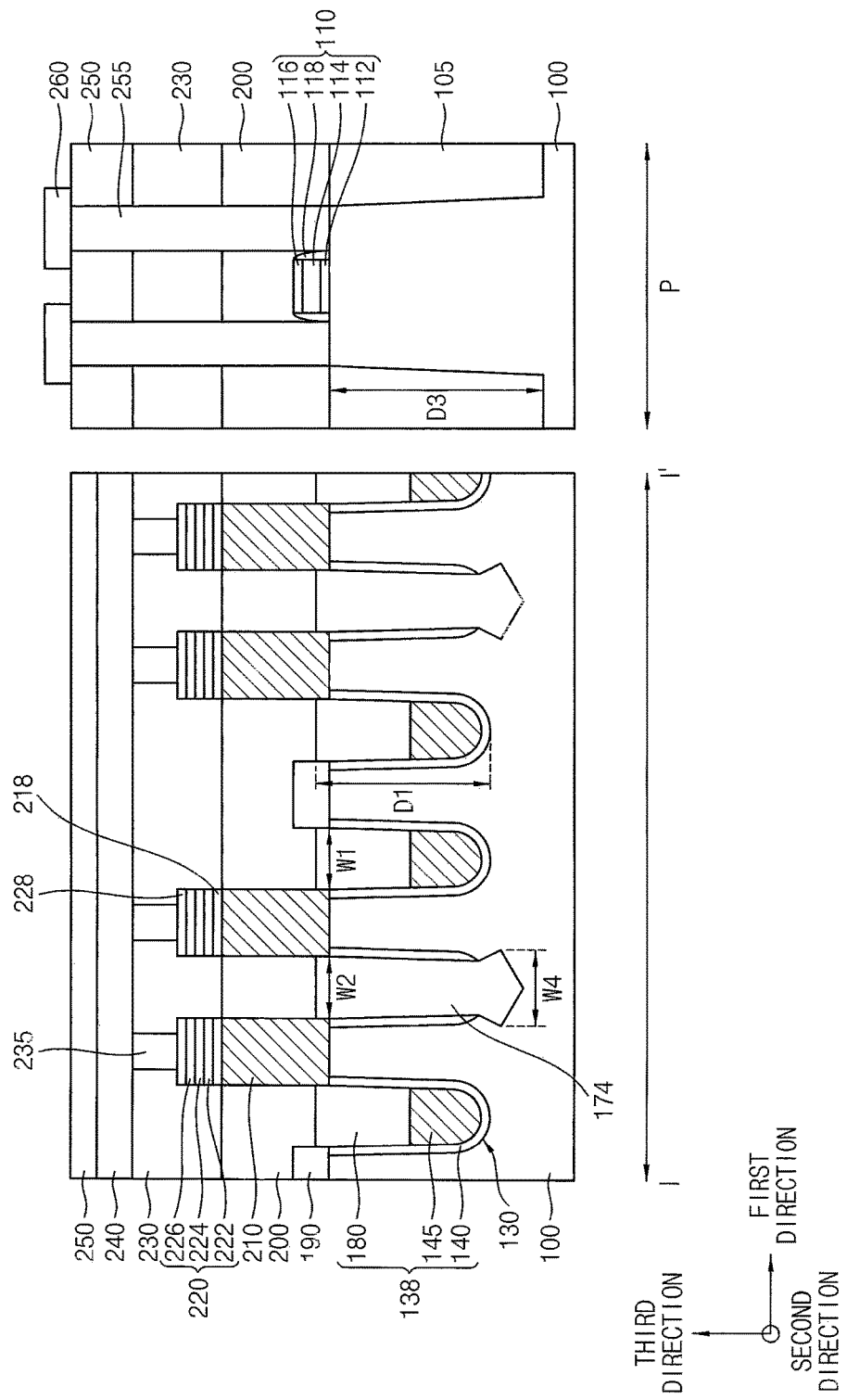

FIG. 5 is a cross-sectional view illustrating a semiconductor device in accordance with some example embodiments. The semiconductor device may be substantially the same as or similar to that illustrated with reference to FIGS. 1 to 3 except for the insulation layer pattern.

Referring to FIG. 5, a semiconductor device may include the isolation layers 105 and 107, an insulation layer pattern 174, the gate structures 138, the MTJ structure 220, the source line 190, and the bit line 240.

A top portion of the insulation layer pattern 174 may have the second width W2 in the first direction, and a bottom portion of the insulation layer pattern 174 may have the fourth width W4 in the first direction. In some example embodiments, the fourth width W4 may be greater than the second width W2. A lower portion of the insulation layer pattern 174 may fill a recess formed by an etching process that will be illustrated with reference to FIG. 22C later. Accordingly, the lower portion of the insulation layer pattern 174 may have an angulated shape.

In some example embodiments, as the width of the bottom portion of the insulation layer pattern 174 increases, the insulation layer pattern 174 may efficiently apply a stress to a portion of the substrate 100 adjacent to the gate electrode 145. Accordingly, the mobility of electric charges of the transistor may be increased.

Figure 6:
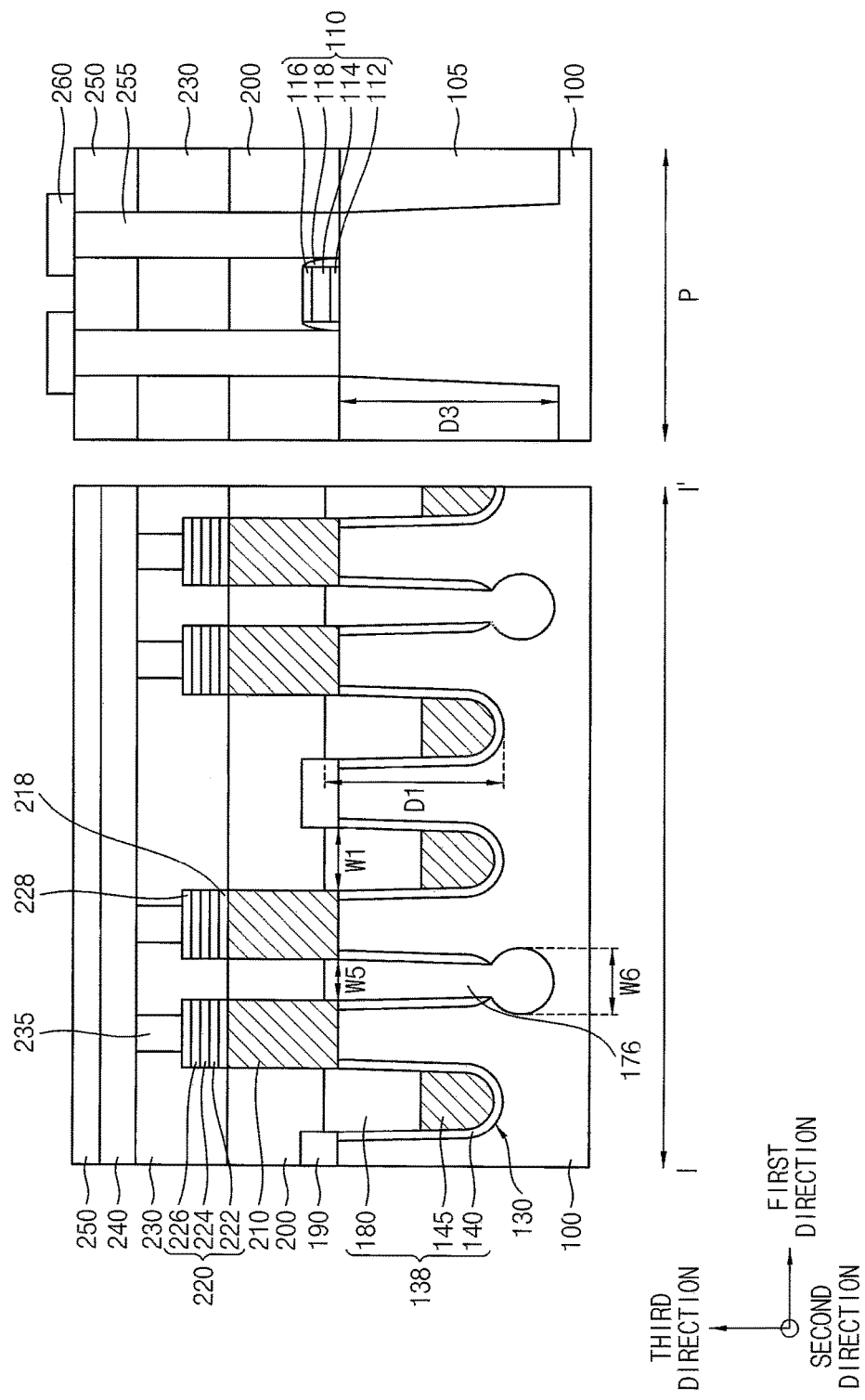

FIG. 6 is a cross-sectional view illustrating a semiconductor device in accordance with some example embodiments. The semiconductor device may be substantially the same as or similar to that illustrated with reference to FIGS. 1 to 3 except for the insulation layer pattern.

Referring to FIG. 6, a semiconductor device may include the isolation layers 105 and 107, an insulation layer pattern 176, the gate structures 138, the MTJ structure 220, the source line 190, and the bit line 240.

A top portion of the insulation layer pattern 176 may have a fifth width W5 in the first direction, and a bottom portion of the insulation layer pattern 176 may have a sixth width W6 in the first direction. In some example embodiments, the fifth width W5 may be less than the sixth width W6. The fifth width W5 of the top portion of the insulation layer pattern 176 may be less than the first width W1 of the top of the gate trench 130. As the fifth width W5 of the top portion of the insulation layer pattern 176 decreases, a width of an upper portion of the substrate 100, that is, the active pattern between the insulation layer pattern 176 and the gate mask 180 may increase. Accordingly, a contact resistance of the active pattern may decrease, and an electrical characteristics of the semiconductor device may be improved.

Additionally, as the width of the bottom portion of the insulation layer pattern 176 increases, the insulation layer pattern 176 may efficiently apply a stress to a portion of the substrate 100 adjacent to the gate electrode 145. Accordingly, the mobility of electric charges of the transistor may be increased.

Figure 7:
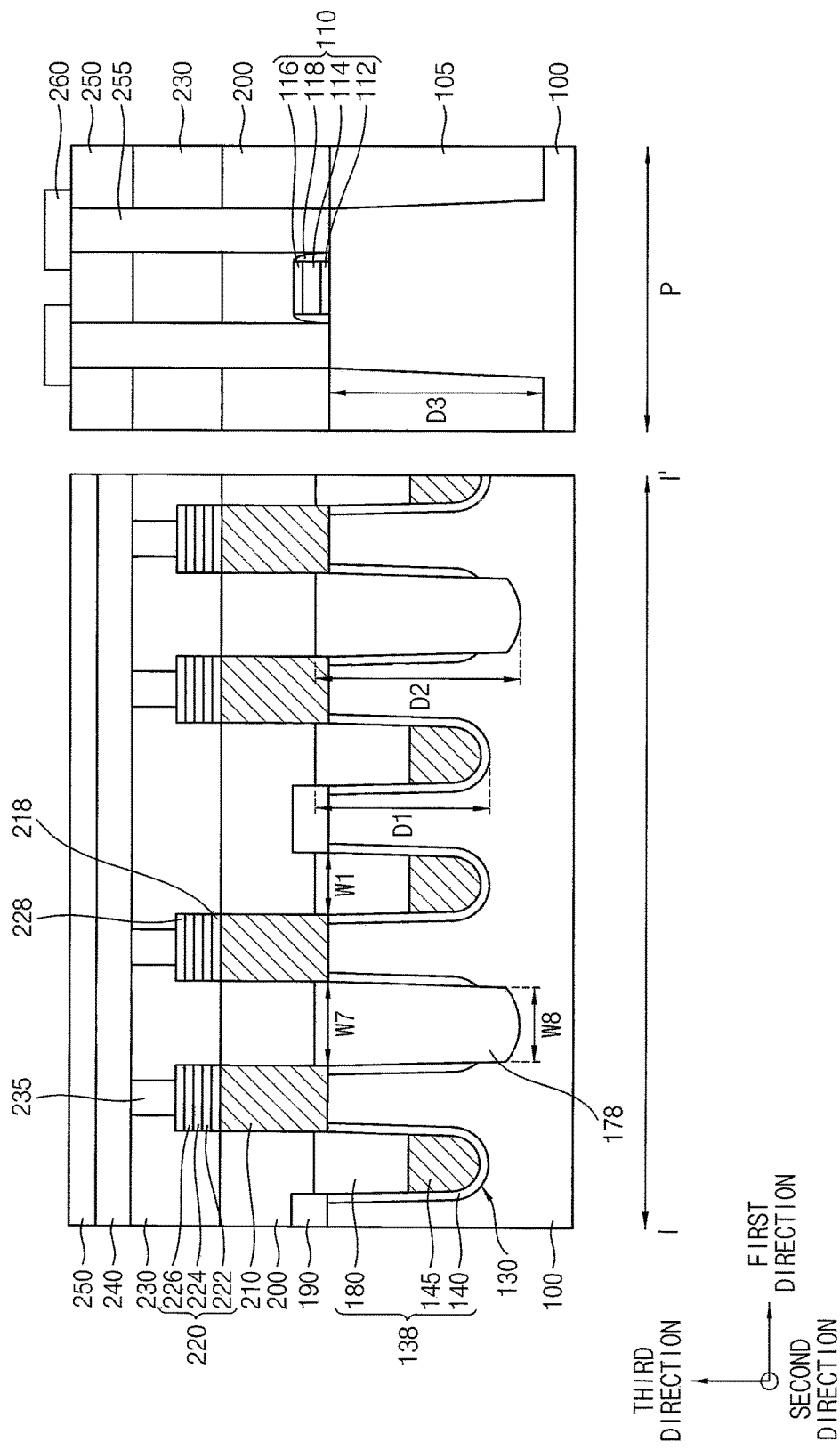

FIG. 7 is a cross-sectional view illustrating a semiconductor device in accordance with some example embodiments. The semiconductor device may be substantially the same as or similar to that illustrated with reference to FIGS. 1 to 3 except for the insulation layer pattern.

Referring to FIG. 7, a semiconductor device may include the isolation layers 105 and 107, an insulation layer pattern 178, the gate structures 138, the MTJ structure 220, the source line 190, and the bit line 240.

A top portion of the insulation layer pattern 178 may have a seventh width W7 in the first direction, and a bottom portion of the insulation layer pattern 178 may have an eighth width W8 in the first direction. In some example embodiments, a width of the insulation layer pattern 178 may gradually decrease from the top portion toward the bottom portion thereof. The seventh width W7 of the top portion of the insulation layer pattern 178 may be greater than the first width W1 of the top of the gate trench 130. As the seventh width W7 of the top portion of the insulation layer pattern 178 increases, the eighth width W8 of the bottom portion of the insulation layer pattern 178 may be also increased correspondingly. Accordingly, the gate insulation layer 178 may efficiently apply a stress to a portion of the substrate 100 adjacent to the gate electrode 145.

FIGS. 8 to 35 are plan views and cross-sectional views illustrating steps of a method of manufacturing a semiconductor device.

Particularly, FIGS. 8, 12, 21, 26, 28, and 32 are plan views of a cell region of the semiconductor device. Each of FIGS. 9, 11, 13, 15, 17, 19, 22A, 22B, 22C, 24, 29, 31, 33, and 35 illustrates cross-sectional view of the cell region of the semiconductor device taken along a line I-I' and a peripheral region of the semiconductor device. Each of FIGS. 10, 14, 16, 18, 20, 23, 25, 27, 30, and 34 illustrates cross-sectional views of the cell region of the semiconductor device taken along lines II-II', III-III, and IV-IV', respectively.

Figure 9:
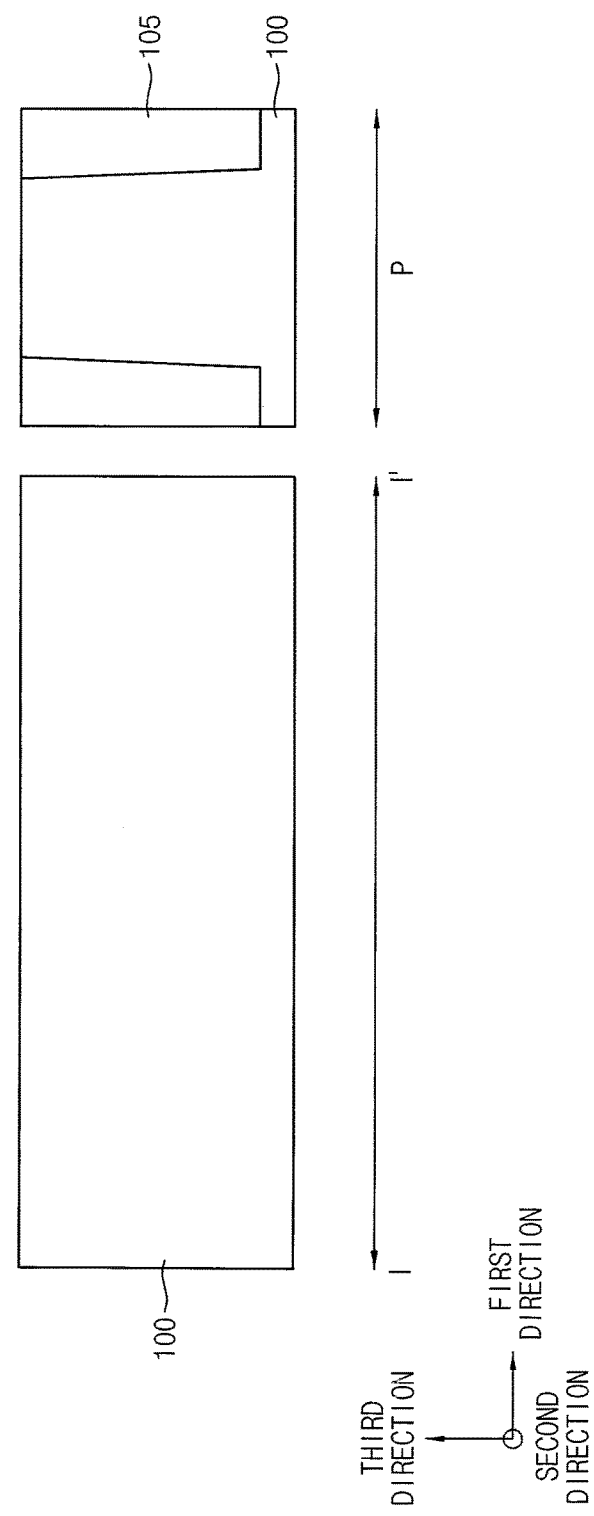
Figure 10:
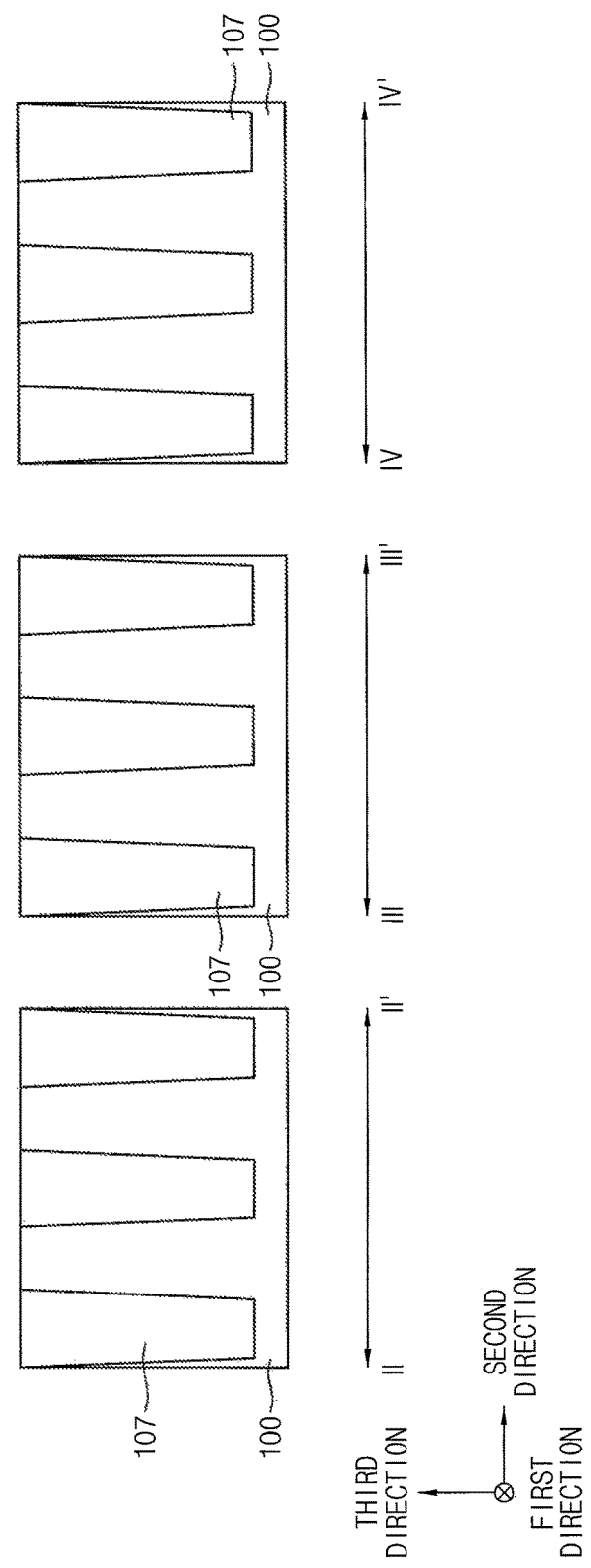

Referring to FIGS. 8 to 10, first and second isolation layers 105 and 107 may be formed on a substrate 100 to define an active region therein.

The substrate 100 may include silicon, germanium, silicon-germanium, and/or III-IV compound semiconductor, e.g., GaP, GaAs, GaSb, or the like. In some example embodiments, the substrate 100 may be an SOI substrate or a GOI substrate. The substrate 100 may be divided into a cell region in which memory cells of the semiconductor device may be formed, and a peripheral region P in which peripheral circuits may be formed. As mentioned previously, each of the cell region and the peripheral region P may be defined to include not only a portion of the substrate 100 but also a space over and/or under the portion of the substrate 100 vertically overlapping thereto.

In some example embodiments, the first and second isolation layers 105 and 107 may be formed by a shallow trench isolation (STI) process. For example, a hard mask (not shown) may be formed on a top surface of the substrate 100. An upper portion of the substrate 100 may be removed by an anisotropic etching process using the hard mask as an etching mask to form isolation trenches (not shown). An insulation layer may be formed on the substrate 100 and the hard mask to fill the isolation trenches. The insulation layer and the hard mask may be planarized until the top surface of the substrate 100 may be exposed to form the isolation layers 105 and 107. The planarization process may be performed by, e.g., a chemical mechanical polishing (CMP) process. The isolation layers 105 and 107 may include, e.g., silicon oxide.

The first isolation layer 105 may be formed on the substrate 100 in the peripheral region P, and the second isolation layer 107 may be formed on the substrate 100 in the cell region.

In some example embodiments, the first and second isolation layers 105 and 107 may be formed to have substantially the same depth, and to include substantially the same material. In this case, the processes for forming the first and second isolation layers 105 and 107 may be performed simultaneously.

Alternatively, the first and second isolation layers 105 and 107 may be formed in independent processes. In this case, the first and second isolation layers 105 and 107 may be formed to include different materials, and/or to have different depths from each other.

According as the second isolation layer 107 may be formed on the substrate 100 in the cell region, a plurality of active patterns spaced apart from each other by the second isolation layer 107 may be defined in the substrate 100.

As illustrated in FIG. 8, each of the second isolation layers 107 may extend along a first direction substantially parallel to the top surface of the substrate 100. In some example embodiments, a plurality of second isolation layers 107 may be formed along a second direction substantially perpendicular to the first direction. Accordingly, the plurality of active patterns and the plurality of second isolation layers 107 may be formed alternately and repeatedly along the second direction.

According as the first isolation layer 105 may be formed on the substrate 100 in the peripheral region P, an active pattern may be defined at a portion of the substrate 100 on which no isolation layer is formed in the peripheral region P also.

Figure 11:
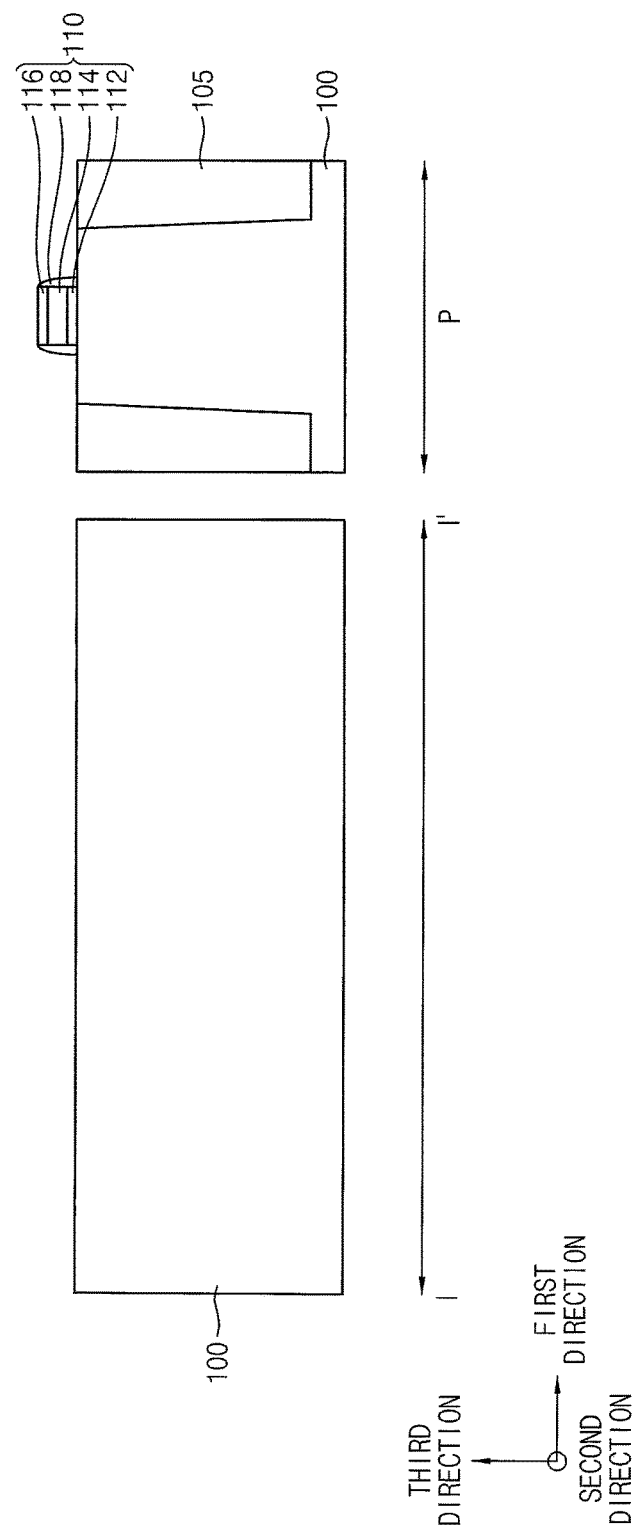

Referring to FIG. 11, a peripheral gate structure 110 may be formed on the substrate 100 in the peripheral region P.

Particularly, a peripheral gate insulation layer, a peripheral gate electrode layer, and a peripheral mask layer may be formed sequentially on the substrate 100 in the peripheral region P. The peripheral gate insulation layer, the peripheral gate electrode layer, and the peripheral mask layer may be partially etched to form a peripheral gate insulation layer pattern 112, a peripheral gate electrode 114, and a peripheral mask pattern 116, respectively. A peripheral spacer 118 may be formed on sidewalls of the peripheral gate insulation layer pattern 112, the peripheral gate electrode 114, and the peripheral mask pattern 116. Accordingly, the peripheral gate structure 110 having the peripheral gate insulation layer pattern 112, the peripheral gate electrode 114, the peripheral mask pattern 116, and the peripheral spacer 118 may be formed.

Impurities may be implanted into a portion of the substrate 100 in the peripheral region P to form an impurity region (not shown). The impurity region may serve as a source region and/or a drain region of the peripheral gate structure 110.

FIG. 11 shows that the process for forming the peripheral gate structure 110 is performed before the process for forming a gate structure 138 having a buried gate electrode 145 that will be illustrated with reference to FIGS. 12 to 16 later, however, example embodiments of the present inventive concepts are not be limited thereto. Thus, the process for forming the peripheral gate structure 110 may be performed after the process for forming the gate structure 138 having the buried gate electrode 145, or the two processes may be performed simultaneously.

Figure 12:
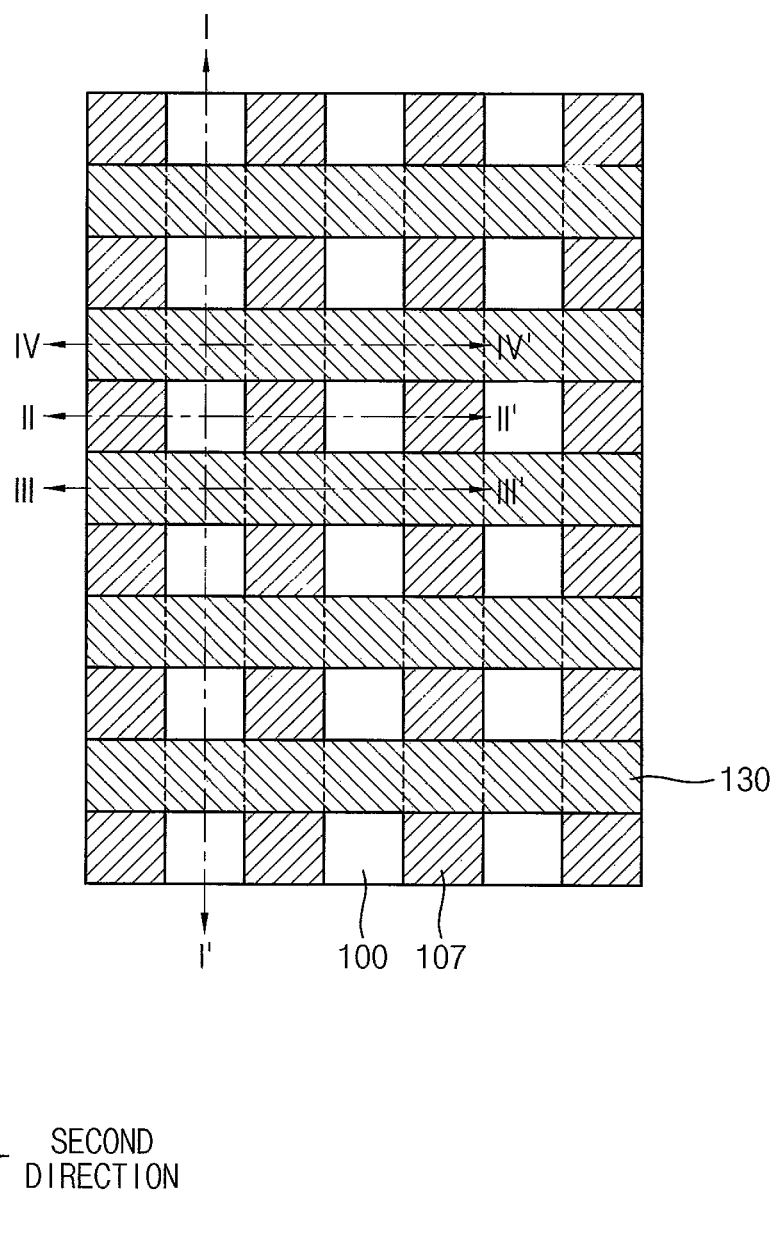
Figure 13:
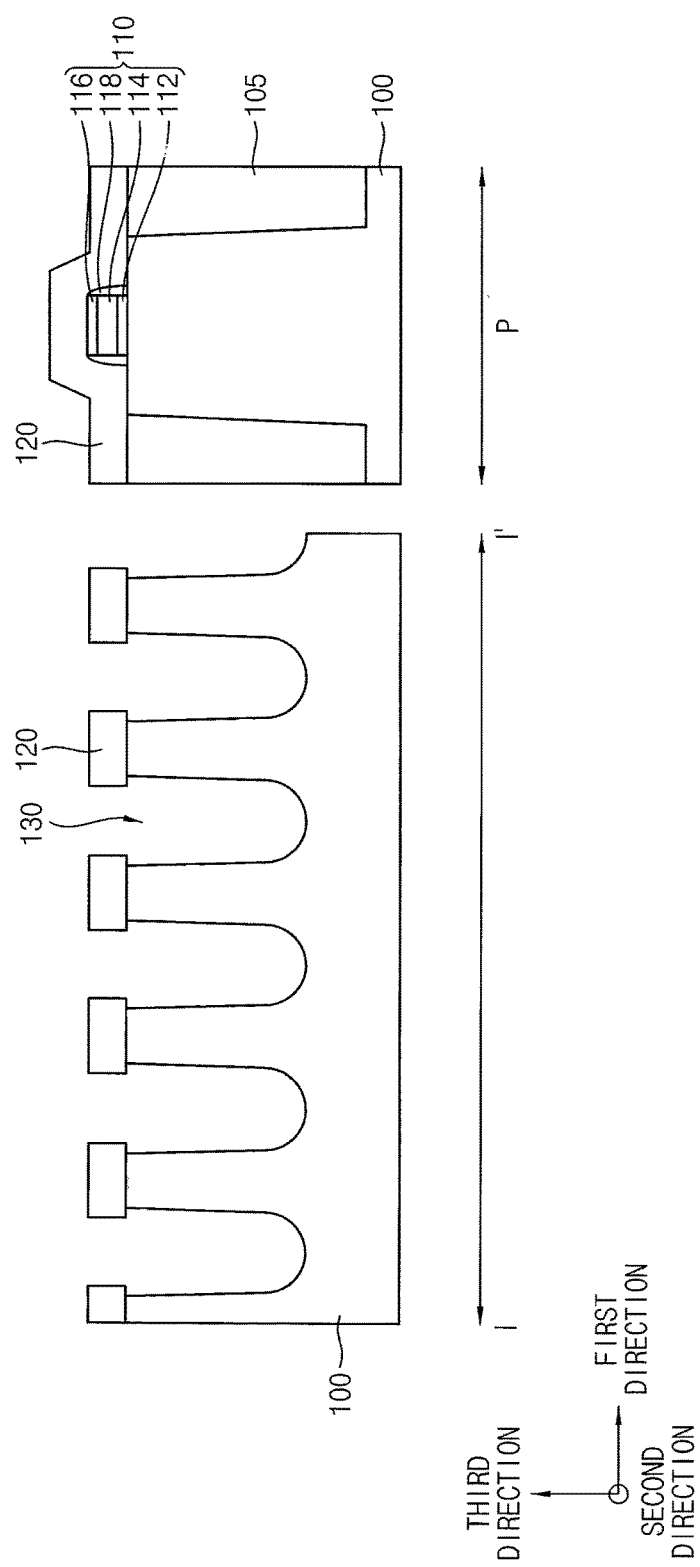
Figure 14:
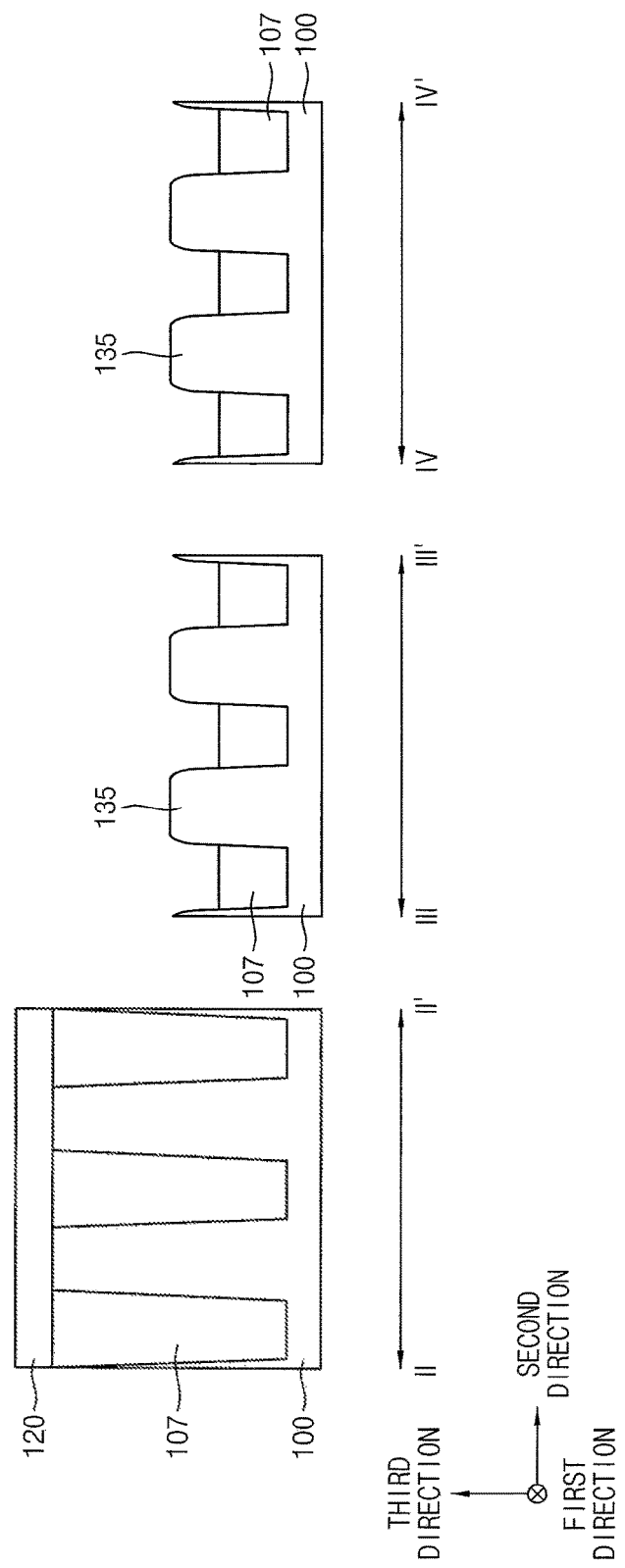

Referring to FIGS. 12 to 14, upper portions of the substrate 100 and the second isolation layer 107 in the cell region may be removed to form a gate trench 130.

Particularly, a first mask layer 120 including an oxide, e.g., silicon oxide may be formed on the substrate 100 and the second isolation layer 107. The upper portions of the substrate 100 and the second isolation layer 107 in the cell region may be removed using the first mask layer 120 as an etching mask. The first mask layer 120 may be formed to cover the gate structure 110 on the substrate 100 in the peripheral region P.

In some example embodiments, a plurality of gate trenches 130 may be formed along the first direction. Each of the gate trenches 130 may extend along the second direction.

At a bottom of the gate trench 130, a portion of the substrate 100 may protrude upwardly from a top surface of the second isolation layer 107. The protruding portion of the substrate 100 may be defined as a semiconductor fin 135.

A depth of the gate trench 130 may be less than that of the first and second isolation layers 105 and 107. For example, the depth of the gate trench 130 may be in a range of about 25% to about 60% of the depth of the first and second isolation layers 105 and 107.

Figure 15:
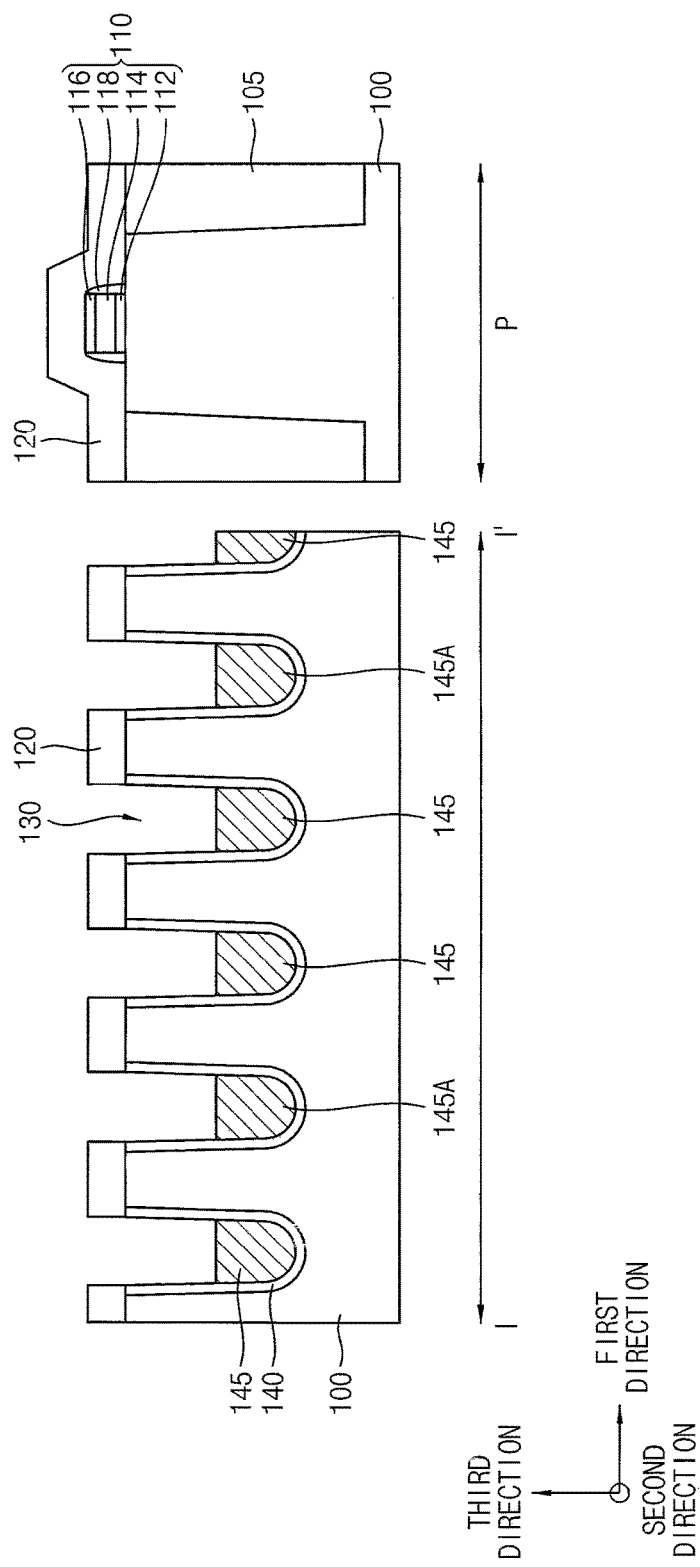
Figure 16:
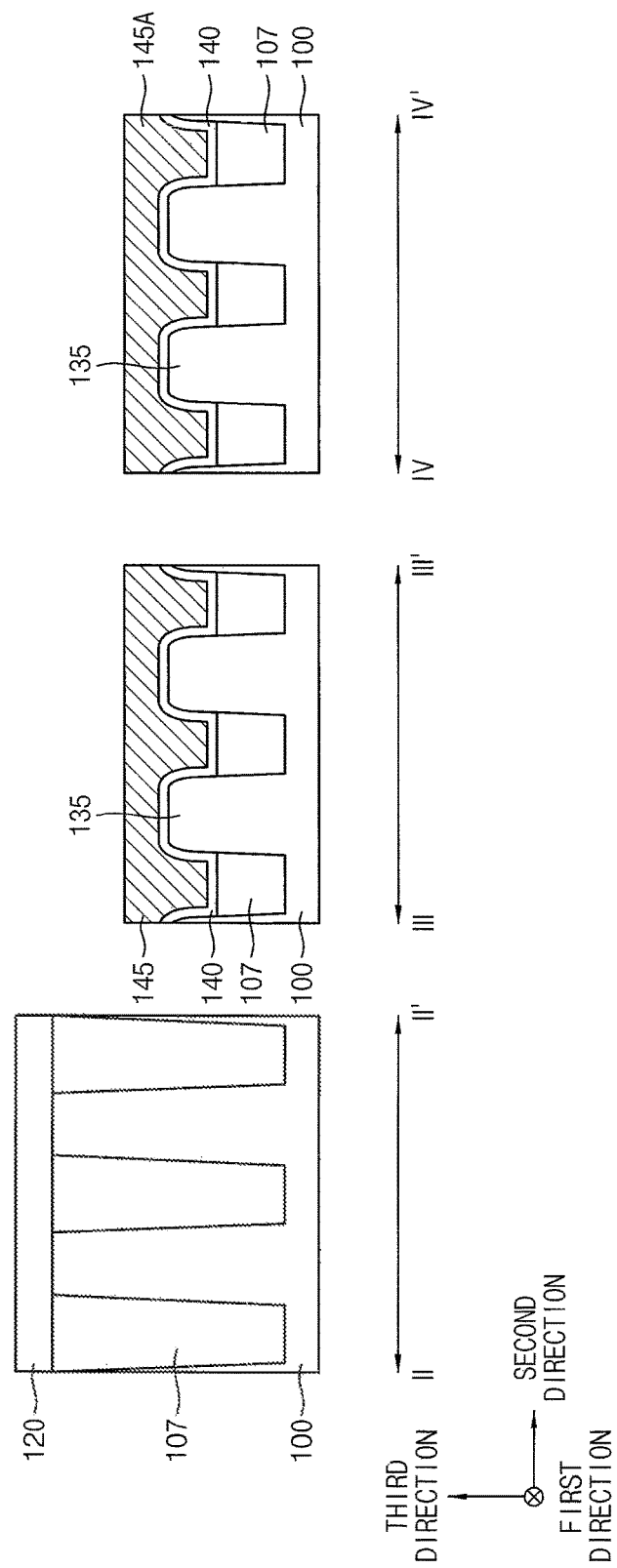

Referring to FIGS. 15 and 16, a gate insulation layer 140 may be formed on an inner wall of the gate trench 130, and the gate electrode 145 and a sacrificial gate electrode 145A filling a lower portion of the gate trench 130 may be formed.

Particularly, the gate insulation layer 140 may be formed by thermally oxidizing a portion of the substrate 100 exposed by the gate trench 130. Alternatively, an oxide, e.g., silicon oxide, a metal oxide, or the like, may be deposited by a CVD process, an ALD process, or the like, to form the gate insulation layer 140.

A gate conductive layer filling the gate trench 130 may be formed on the gate insulation layer 140. The gate conductive layer may be planarized by performing a CMP process until a top surface of the first mask layer 120 may be exposed, and the gate conductive layer may be partially removed by an etch-back process. Accordingly, each of the gate electrode 145 and the sacrificial gate electrode 145A may fill the lower portion of the gate trench 130.

The gate conductive layer may be formed to include a metal, e.g., tantalum, aluminum, tungsten, or the like. Alternatively, the gate conductive layer may be formed to include a metal nitride, e.g., titanium nitride, tantalum nitride, tungsten nitride, or the like. The gate conductive layer may be formed by, e.g., an ALD process, a sputtering process, a physical vapor deposition (PVD) process, a CVD process, or the like.

In some example embodiments, a pair of gate electrodes 145 and the sacrificial gate electrode 145A may be alternately and repeatedly formed along the first direction. Accordingly, the pair of the gate electrodes 145 may be disposed between the sacrificial gate electrodes 145A adjacent to each other along the first direction.

Figure 17:
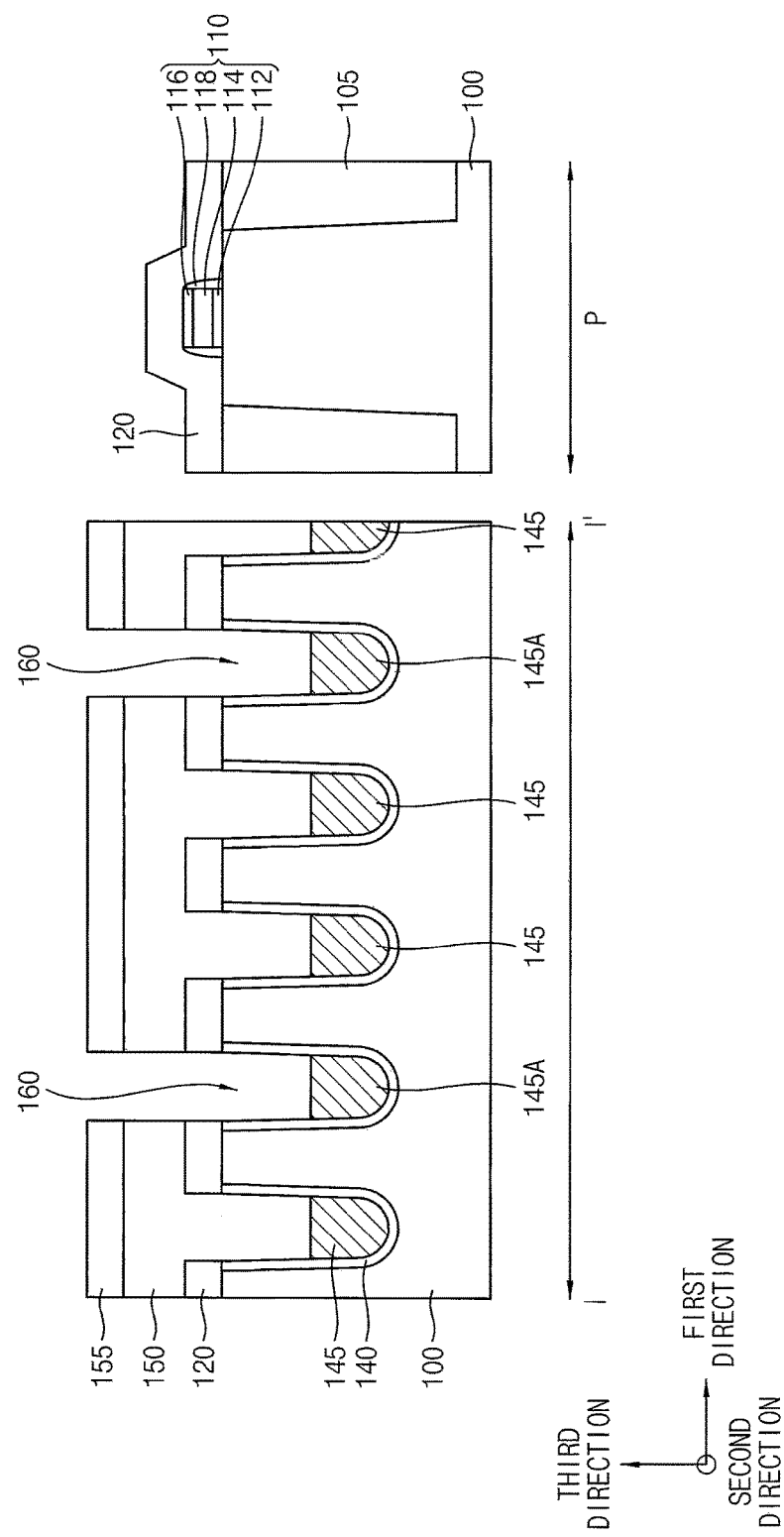
Figure 18:
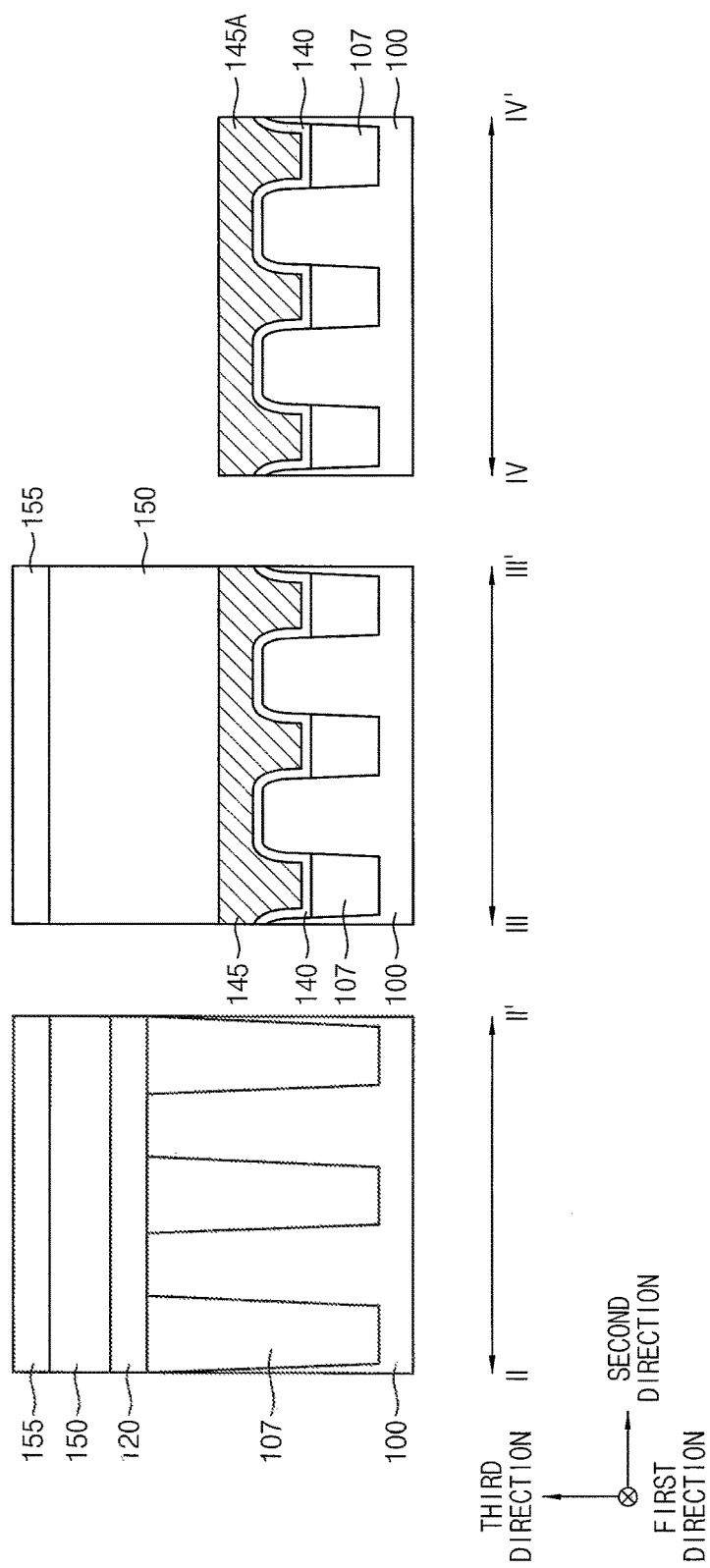

Referring to FIGS. 17 and 18, a gate mask layer 150 and a second mask layer 155 may be sequentially formed on the gate insulation layer 140, the gate electrode 145, and the first mask layer 120. The gate mask layer 150 and the second mask layer 155 may have a preliminary recess 160 therethrough exposing the sacrificial gate electrode 145A.

Particularly, the gate mask layer 150 and the second mask layer 155 may be sequentially formed on the gate insulation layer 140, the gate electrode 145, the sacrificial gate electrode 145A, and the first mask layer 120. The second mask layer 155 and the gate mask layer 150 may be partially removed to form the preliminary recess 160 therethrough exposing the sacrificial electrode 145A.

In some example embodiments, the gate mask layer 150 may be formed to include a nitride, e.g., silicon nitride. The second mask layer 155 may be formed to include silicon nitride, silicon oxide, silicon oxynitride, a carbon-based material layer, e.g., an amorphous carbon layer (ACL), spin-on-hardmask (SOH), or the like. The gate mask layer 150 may be formed to have a single layer structure or a multi-layered structure.

After forming the preliminary recess 160, the second mask layer 155 may be removed by an etching process, a strip process, an ashing process, or the like.

Figure 19:
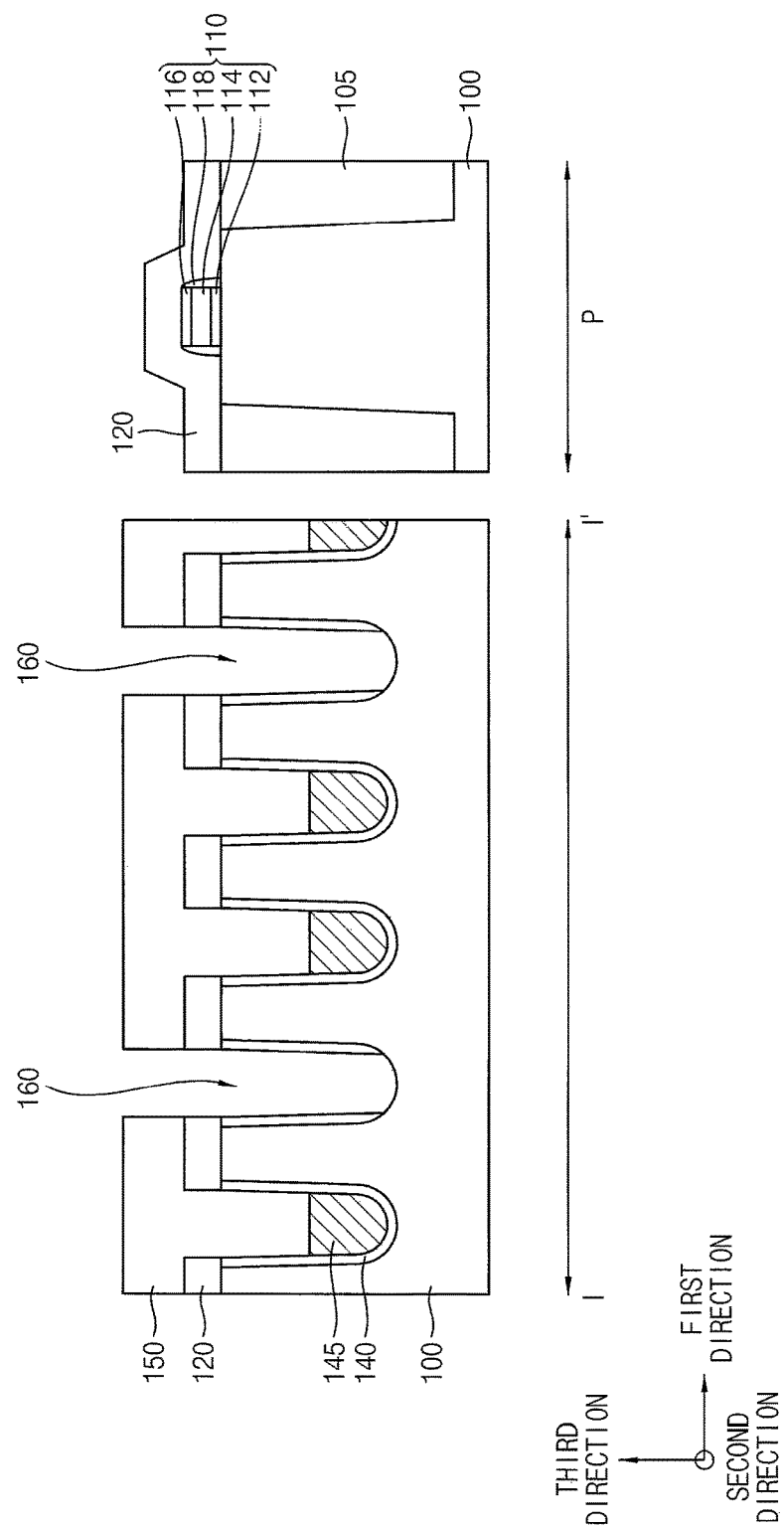
Figure 20:
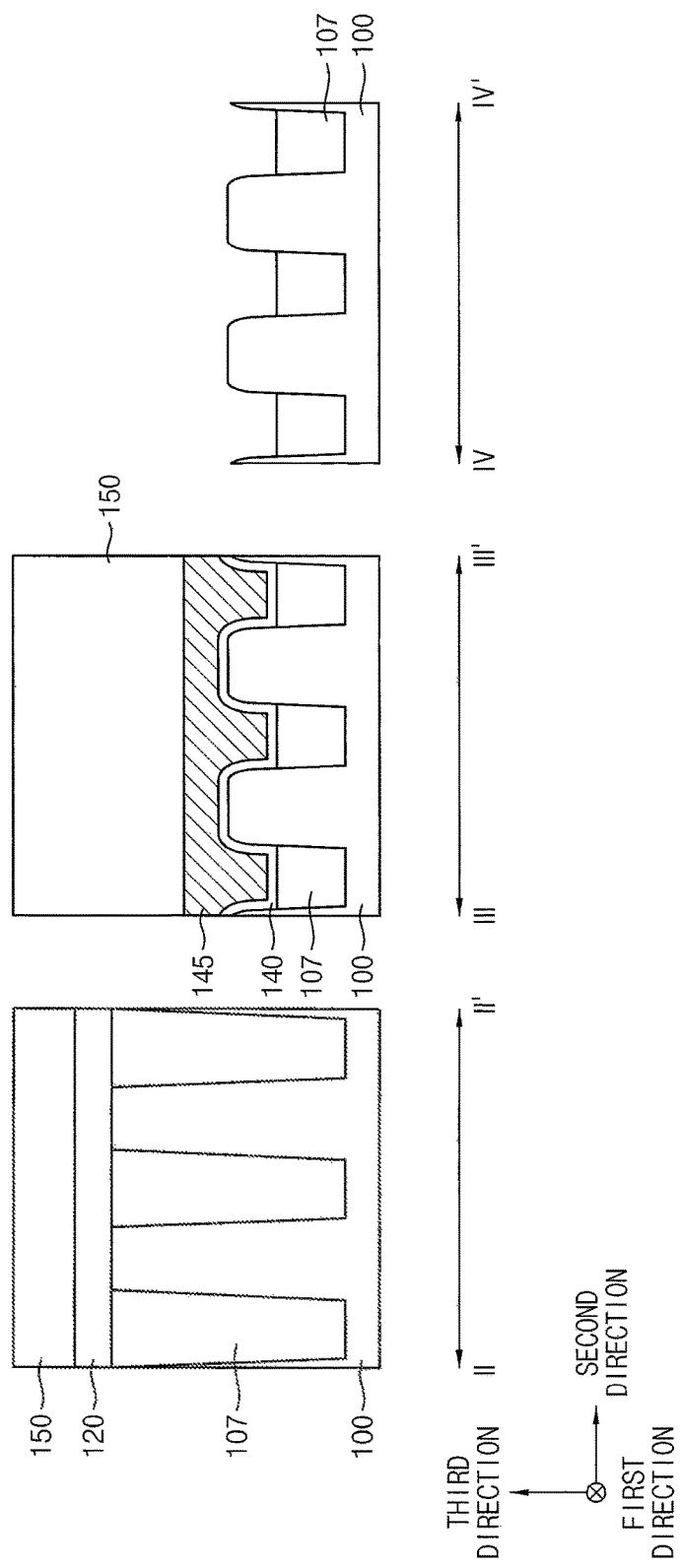

Referring to FIGS. 19 and 20, the sacrificial gate electrode 145A and a portion of the gate insulation layer 140 thereunder may be removed.

The sacrificial gate electrode 145A exposed by the preliminary recess 160 may be removed by an etching process. The portion of the gate insulation layer 140 under the sacrificial gate electrode 145A may be removed by an anisotropic etching process. As the portion of the gate insulation layer 140 is removed, a portion of the substrate 100 may be exposed to the preliminary recess 160.

In some example embodiments, the etching process for removing the sacrificial gate electrode 145A and the etching process for removing the portion of the gate insulation layer 140 may be performed in sequence. After each etching process, an ashing process and/or a strip process may be further performed.

Figure 21:
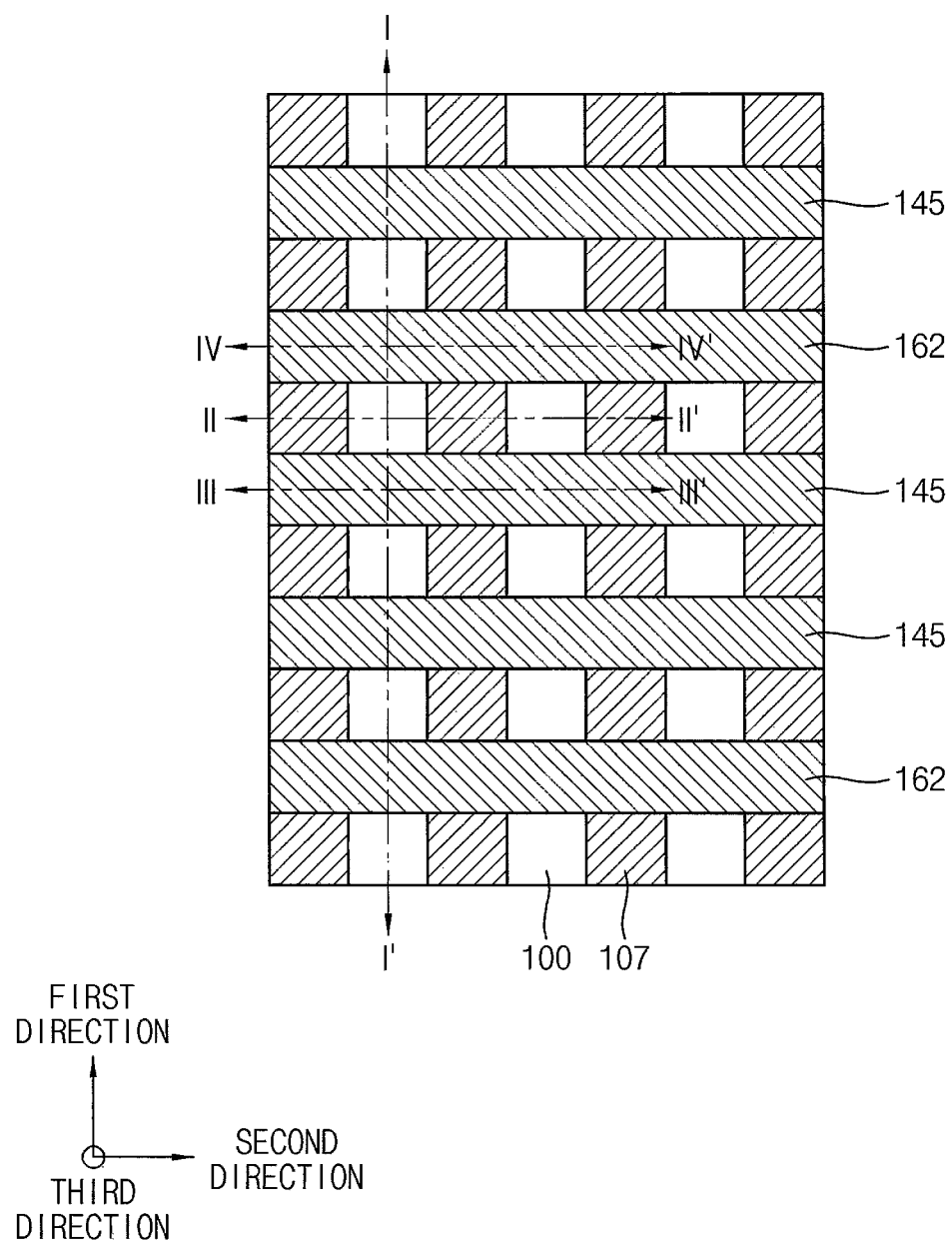
Figure 22A:
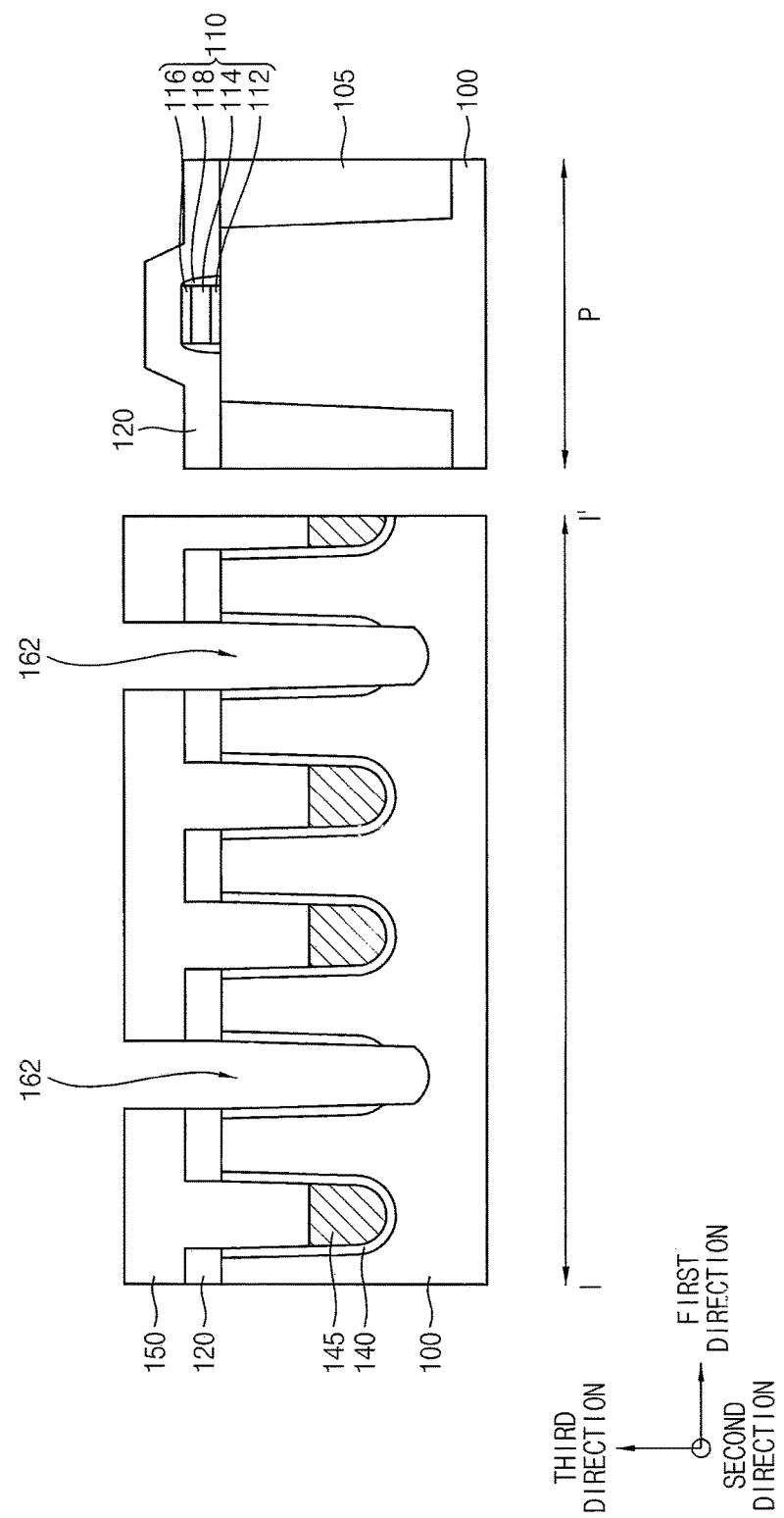
Figure 22B:
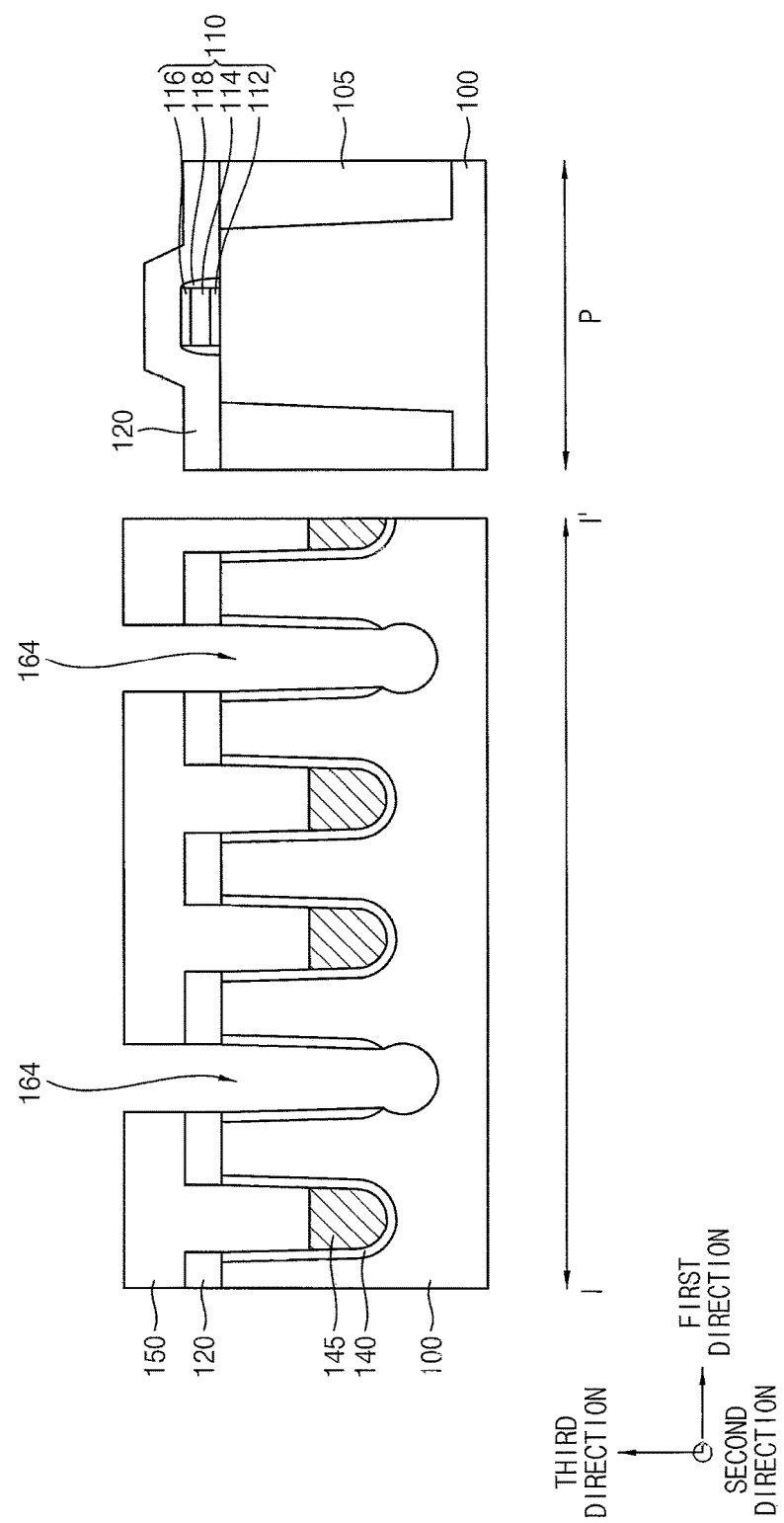
Figure 22C:
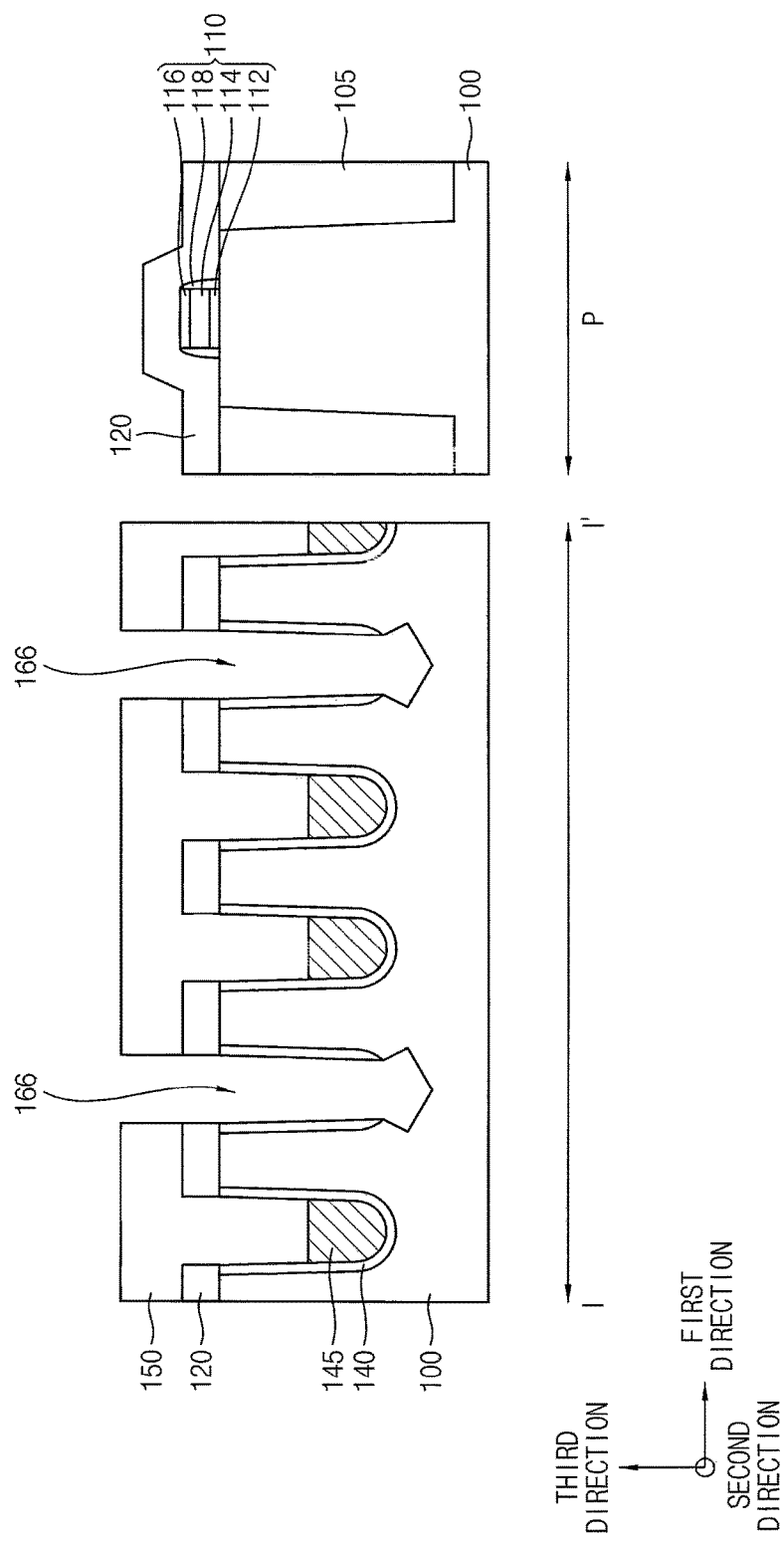
Figure 23:
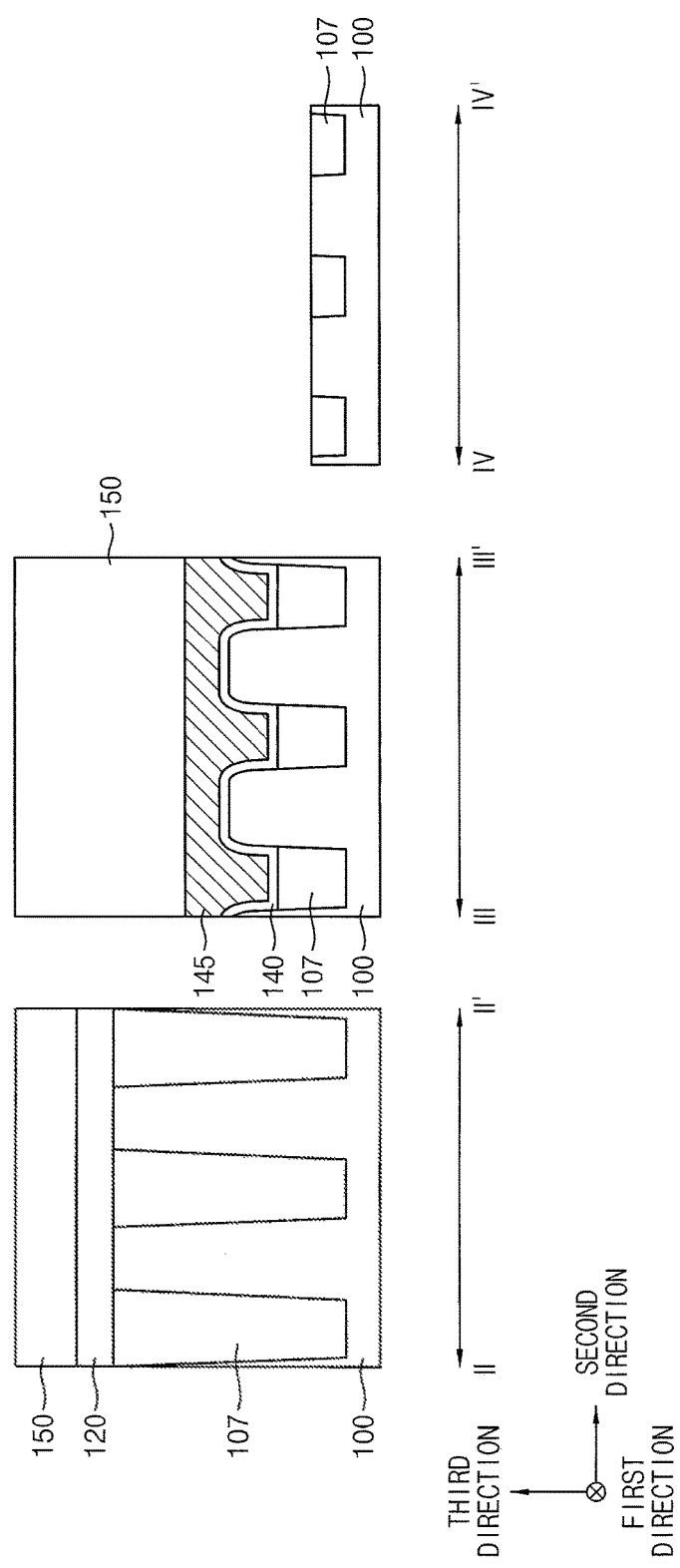

Referring to FIGS. 21 to 23, the portion of the substrate 100 exposed by the preliminary recess 160 may be removed to form a recess 162, 164, or 166.

The portion of the substrate 100 exposed by the preliminary recess 160 may be removed using the gate mask layer 150 as an etching mask. The etching process may include a dry etching process, a wet etching process, or a process combining characteristics of the dry and wet etching processes.

In some example embodiments, referring to FIG. 22A, the exposed portion of the substrate 100 may be removed by a dry etching process to form the recess 162. In the dry etching process, an etching gas may be discharged to form plasma, and a bias voltage may be applied to the substrate 100 so that ions of the plasma may be accelerated in a given direction. Accordingly, the ions of the plasma may anisotropically etch the portion of the substrate 100 exposed by the preliminary recess 160. That is, the exposed portion of the substrate 100 may be etched in a direction substantially perpendicular to the substrate 100.

A width of the recess 162 formed by the dry etching process may gradually decrease from a top portion toward a bottom portion thereof. A depth of the recess 162 may be less than that of the first and second isolation layers 105 and 107, and may be greater than that of the gate trench 130.

In some example embodiments, a ratio of the depth of the recess 162 to the depth of the gate trench 130 may be in a range of about 1.5:1 to about 1:1, or, in a range of about 1.2:1 to about 1.01:1.

In some example embodiments, referring to FIG. 22B, the exposed portion of the substrate 100 may be removed by a process combining the characteristics of a dry etching process and a wet etching process to form the recess 164. In the etching process, an etching gas may be discharged to form plasma, and a bias voltage less than a bias voltage commonly used in a dry etching process may be applied to the substrate 100 so that ions of the plasma may be weakly accelerated in a given direction, or may not be applied at all. Accordingly, the ions of the plasma may isotropically etch the portion of the substrate 100 exposed by the preliminary recess 160. That is, the ions of the plasma may be weakly accelerated or may not be accelerated at all, so that the exposed portion of the substrate 100 may be etched without directional properties.

A width of the recess 164 formed by the etching process may gradually increase from a top portion toward a bottom portion thereof. A lower portion of the recess 164 may have a rounded shape. A depth of the recess 164 may be less than that of the first and second isolation layers 105 and 107, and may be greater than that of the gate trench 130.

In some example embodiments, a ratio of the depth of the recess 164 to the depth of the gate trench 130 may be in a range of between about 1.5:1 to about 1:1, or, in a range of about 1.2:1 to about 1.01:1.

In some example embodiments, referring to FIG. 22C, the exposed portion of the substrate 100 may be removed by a wet etching process to form the recess 166. The wet etching process may be performed by an etchant having a high etch rate with respect to a material of the substrate 100. For example, the etchant may include potassium hydroxide (KOH). Accordingly, the portion of the substrate 100 exposed by the preliminary recess 160 may be etched selectively.

In the wet etching process, when the substrate 100 is formed of a single crystalline material, the etch rate may vary according to a crystal direction thereof. Accordingly, a lower portion of the recess 166 may have an angulated shape along a given crystal direction. A width of a bottom of the recess 166 may be greater than that of a top of the recess 166.

A depth of the recess 166 may be less than that of the first and second isolation layers 105 and 107, and may be greater than that of the gate trench 130.

In some example embodiments, a ratio of the depth of the recess 166 to the depth of the gate trench 130 may be in a range of between about 1.5:1 to about 1:1, or, in a range of between about 1.2:1 to about 1.01:1.

Figure 24:
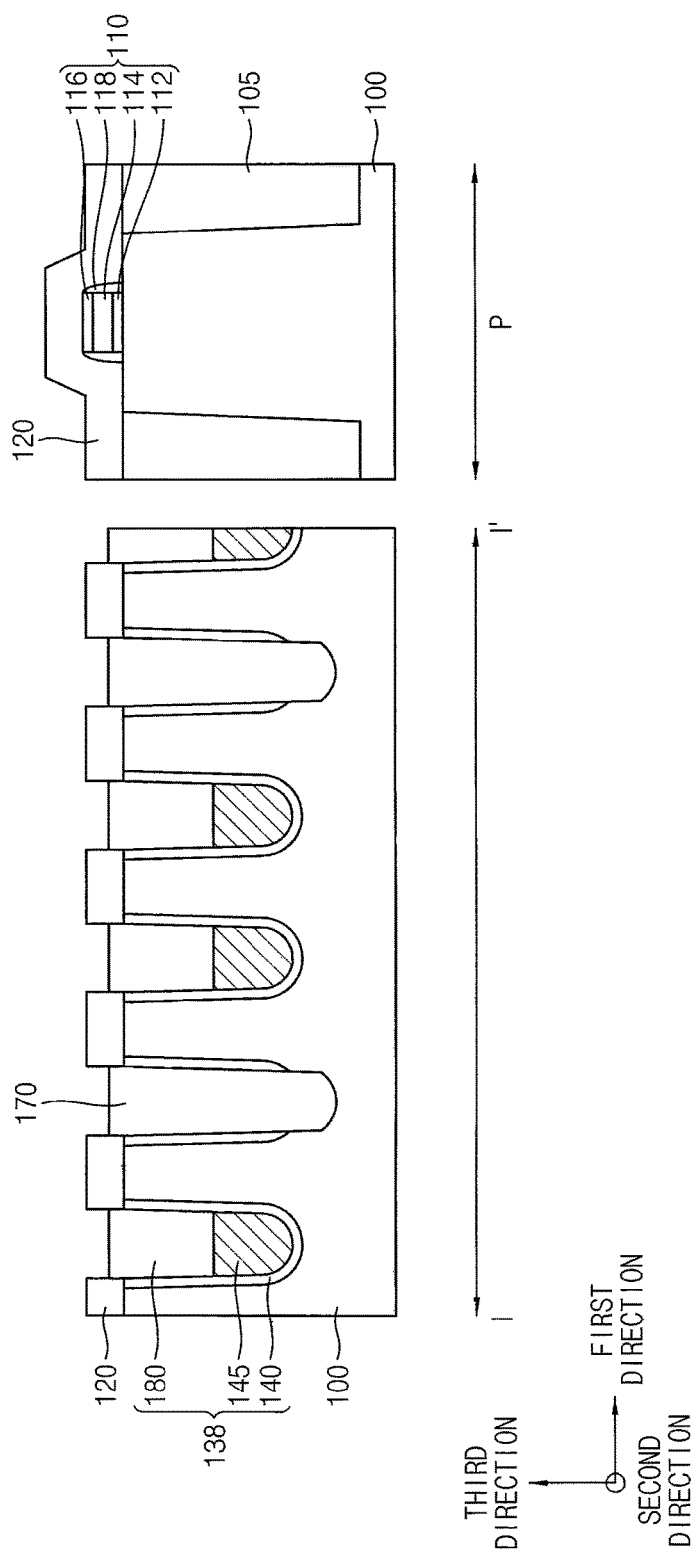
Figure 25:
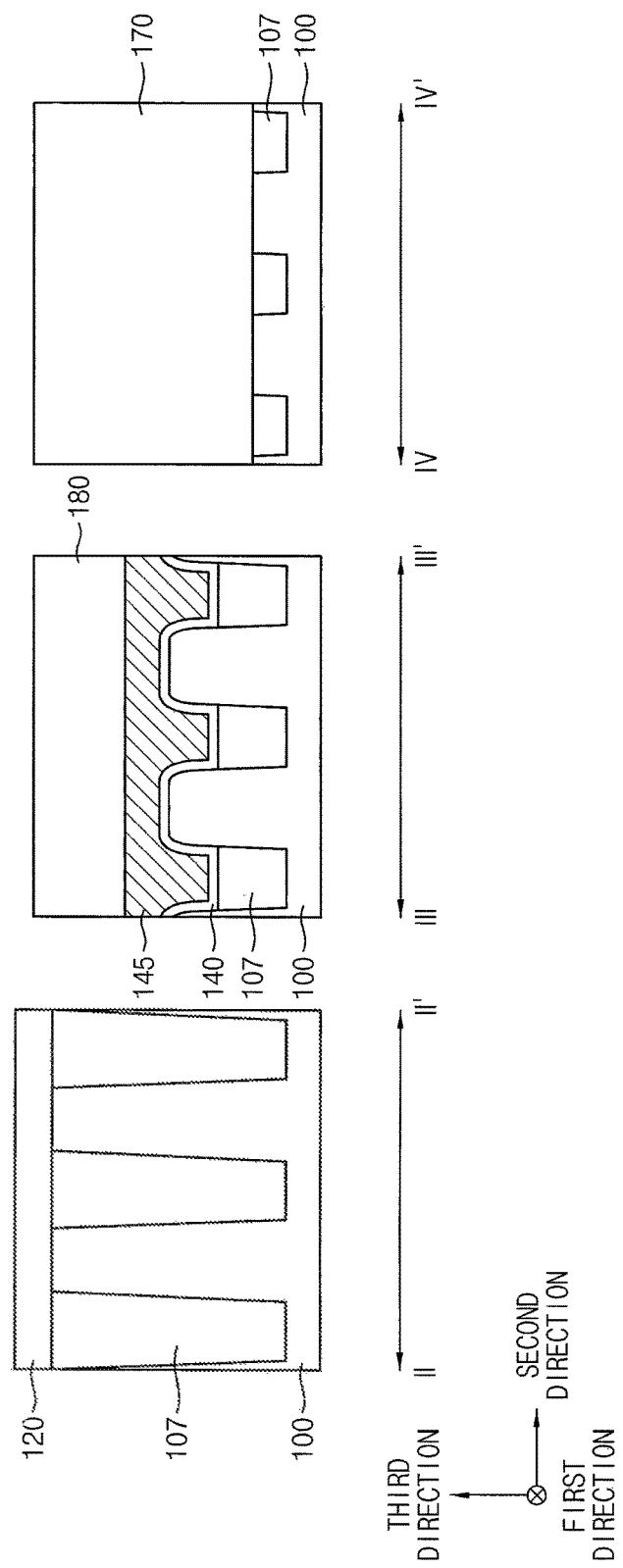

Referring to FIGS. 24 and 25, an insulation layer pattern 170 filling the recess 162 and a gate mask 180 filling an upper portion of the gate trench 130 may be formed.

Particularly, an insulation layer filling the recess 162 may be formed on the gate mask layer 150. Upper portions of the insulation layer and the gate mask layer 150 may be planarized by a CMP process and/or an etch-back process to form the insulation layer pattern 170 and the gate mask 180, respectively.

In some example embodiments, the insulation layer may be formed by a deposition process, e.g., a CVD process, a HDP-CVD process, an ALD process, or a process combining characteristics of these processes. In the deposition process, an insulation material, e.g., silicon oxide, silicon nitride, or the like, may be deposited.

For example, when the insulation layer is formed to include silicon oxide by an ALD process, the insulation layer pattern 170 may have a stress of about −0.3 GPa, and apply a tensile stress to a portion of the substrate 100 adjacent thereto.

Alternatively, when the insulation layer is formed to include silicon nitride by an HDP-CVD process, the insulation layer pattern 170 may have a stress of about −1.8 GPa, and apply a tensile stress to a portion of the substrate 100 adjacent thereto.

Furthermore, when the insulation layer is formed to include silicon nitride by a process combining characteristics of an ALD process and a CVD process, the insulation layer pattern 170 may apply a tensile stress to the neighboring portion of the substrate 100, which may be greater than those formed by the above-mentioned processes.

Figure 26:
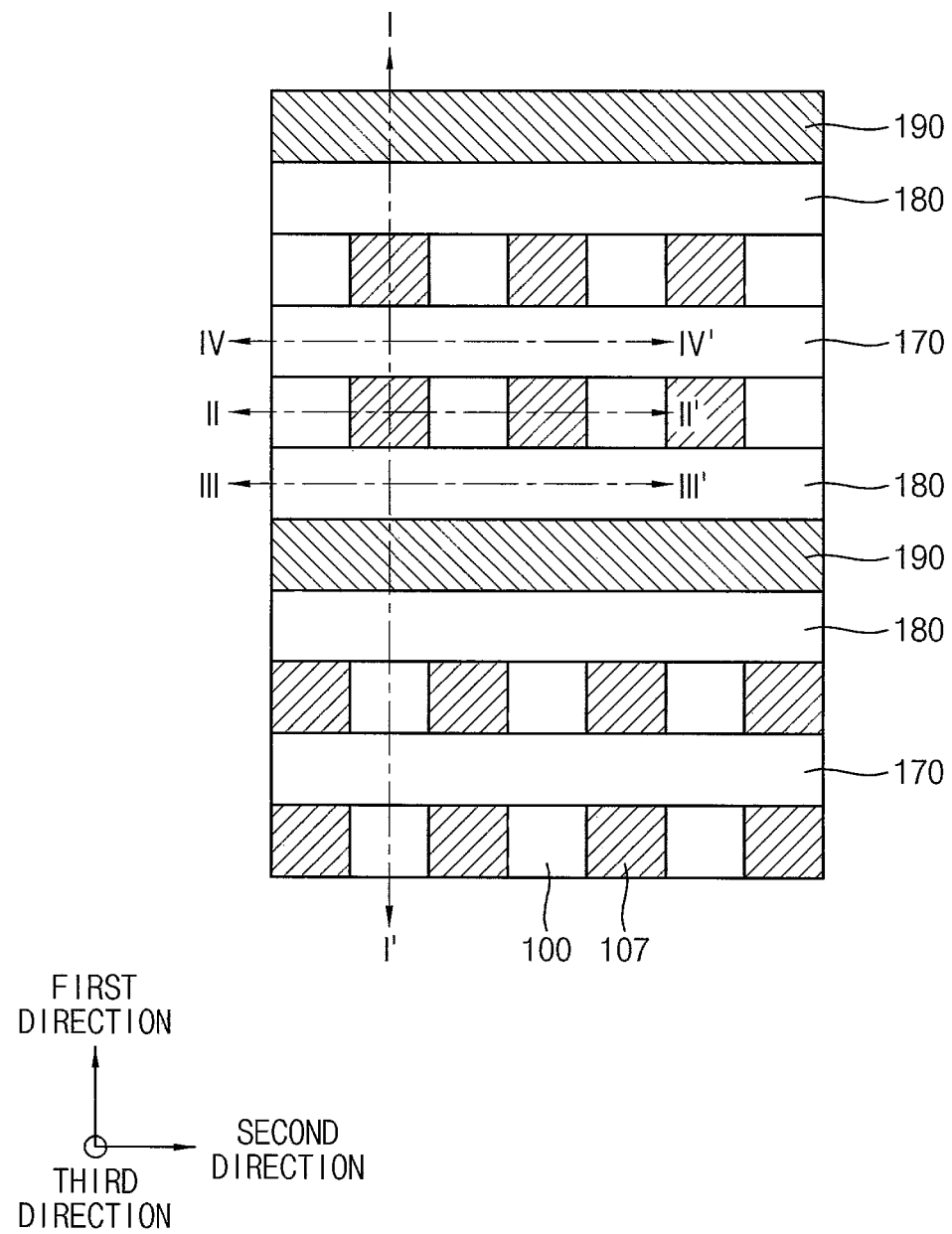
Figure 27:
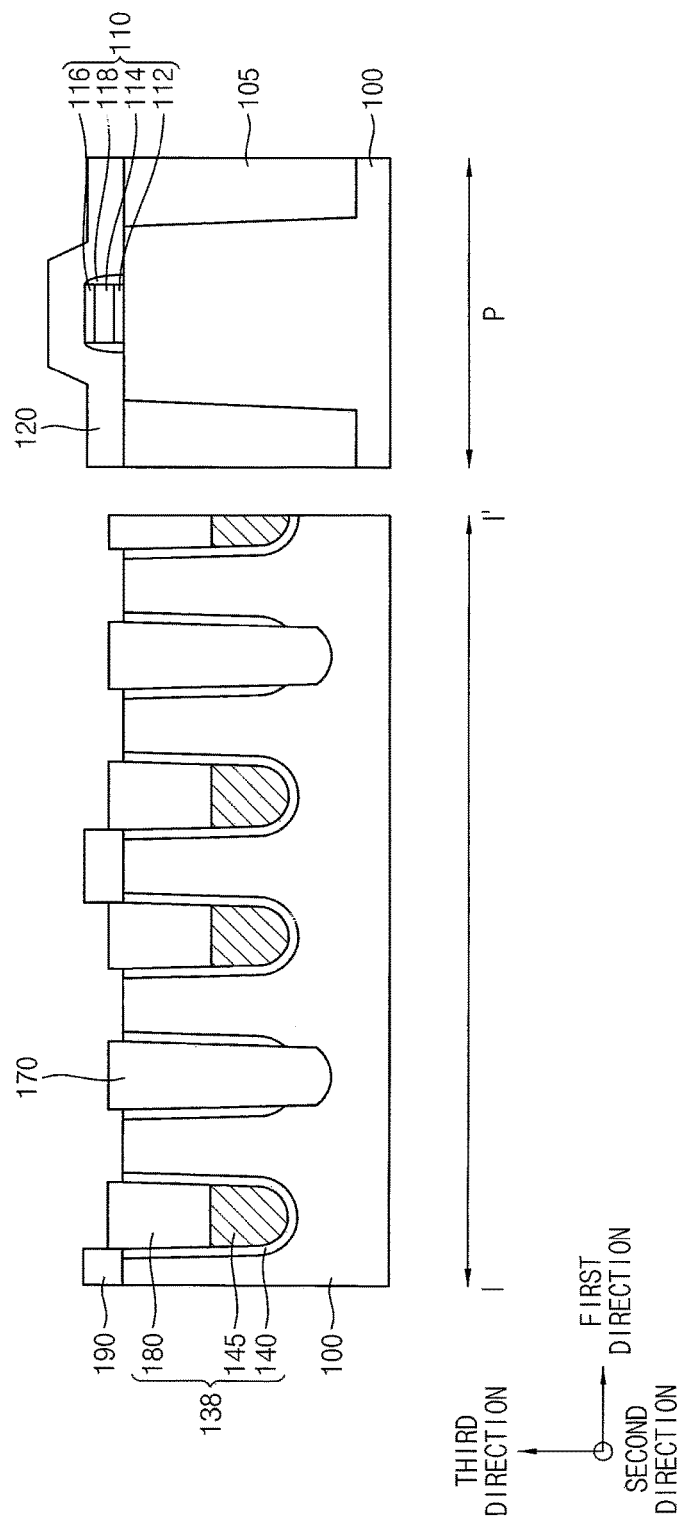

Referring to FIGS. 26 and 27, a source line 190 may be formed on the substrate 100.

Particularly, a first mask 120 on the substrate 100 may be removed. Then, the source line 190 extending along the second direction may be formed on the substrate 100.

In some example embodiments, the source line 190 may be formed on the active pattern, that is, the upper portion of the substrate 100 between a pair of adjacent gate electrodes 145. Accordingly, the source line 190 may apply a source current to a transistor having the pair of adjacent gate electrodes 145.

Figure 28:
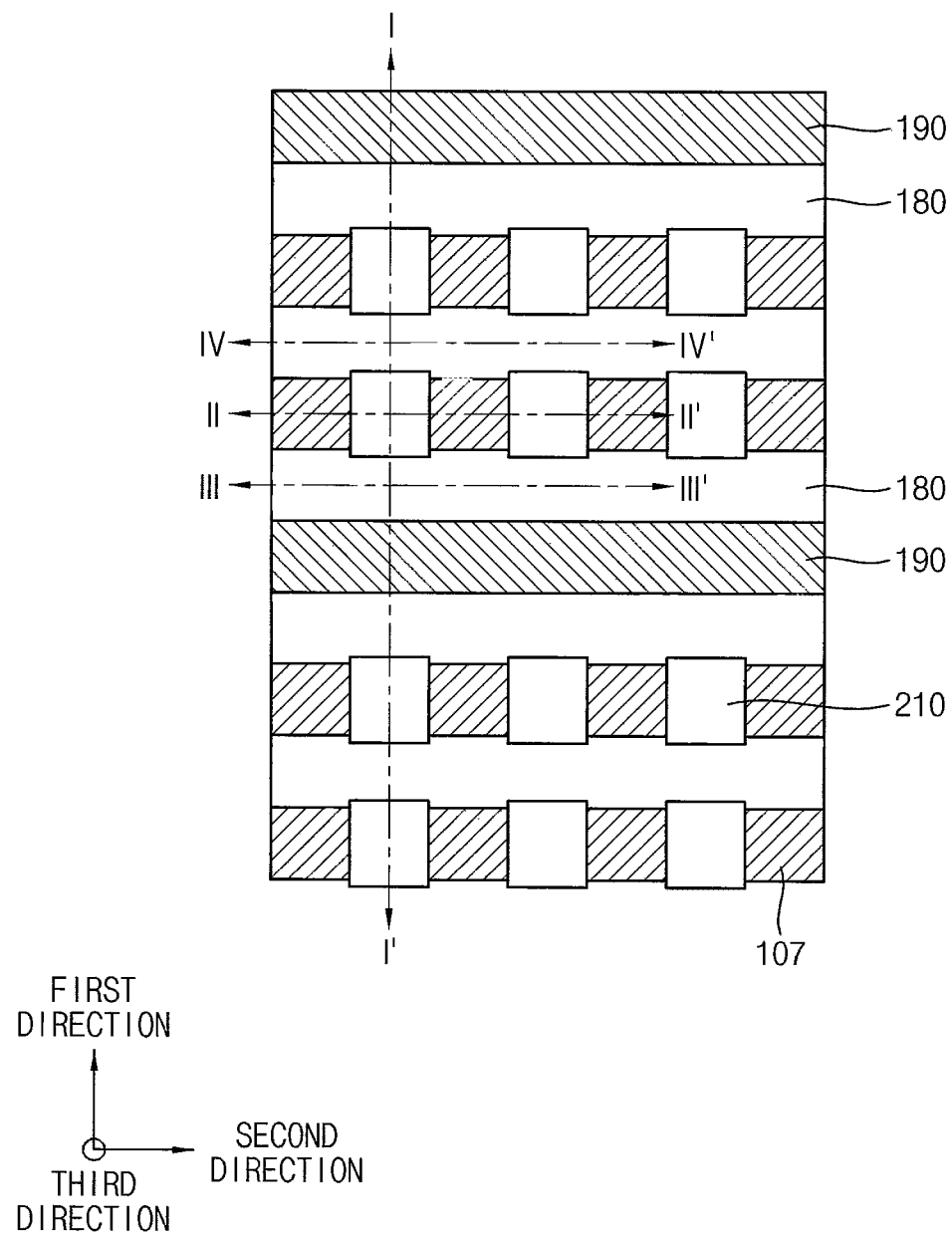
Figure 29:
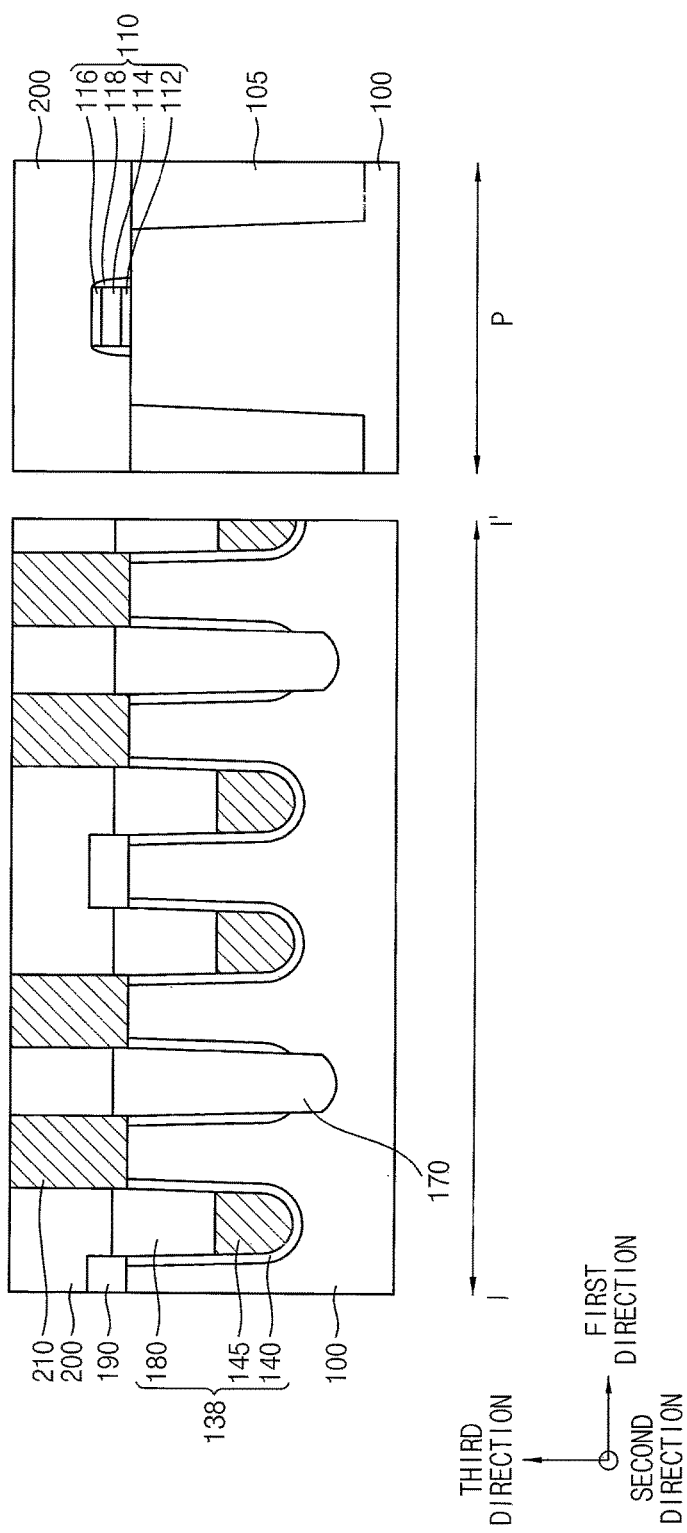
Figure 30:
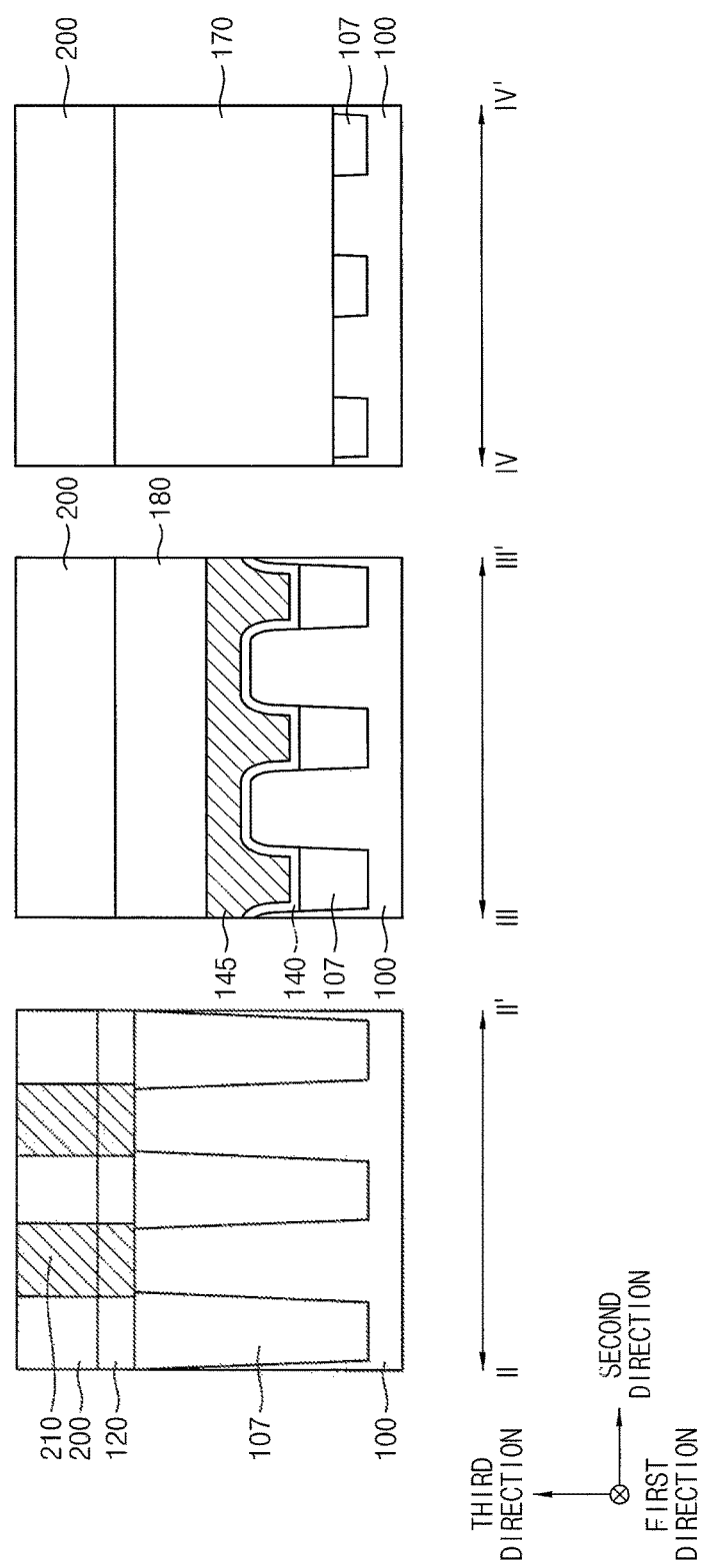

Referring to FIGS. 28 to 30, a first insulating interlayer 200 covering the source line 190, the gate mask 180, and the insulation layer pattern 170 may be formed on the substrate 100. A first contact 210 may be formed through the first insulating interlayer 200.

In some example embodiments, the first contact 210 may be formed on the active pattern, that is, the upper portion of the substrate 100 between the insulation layer pattern 170 and the gate electrode 145.

Figure 31:
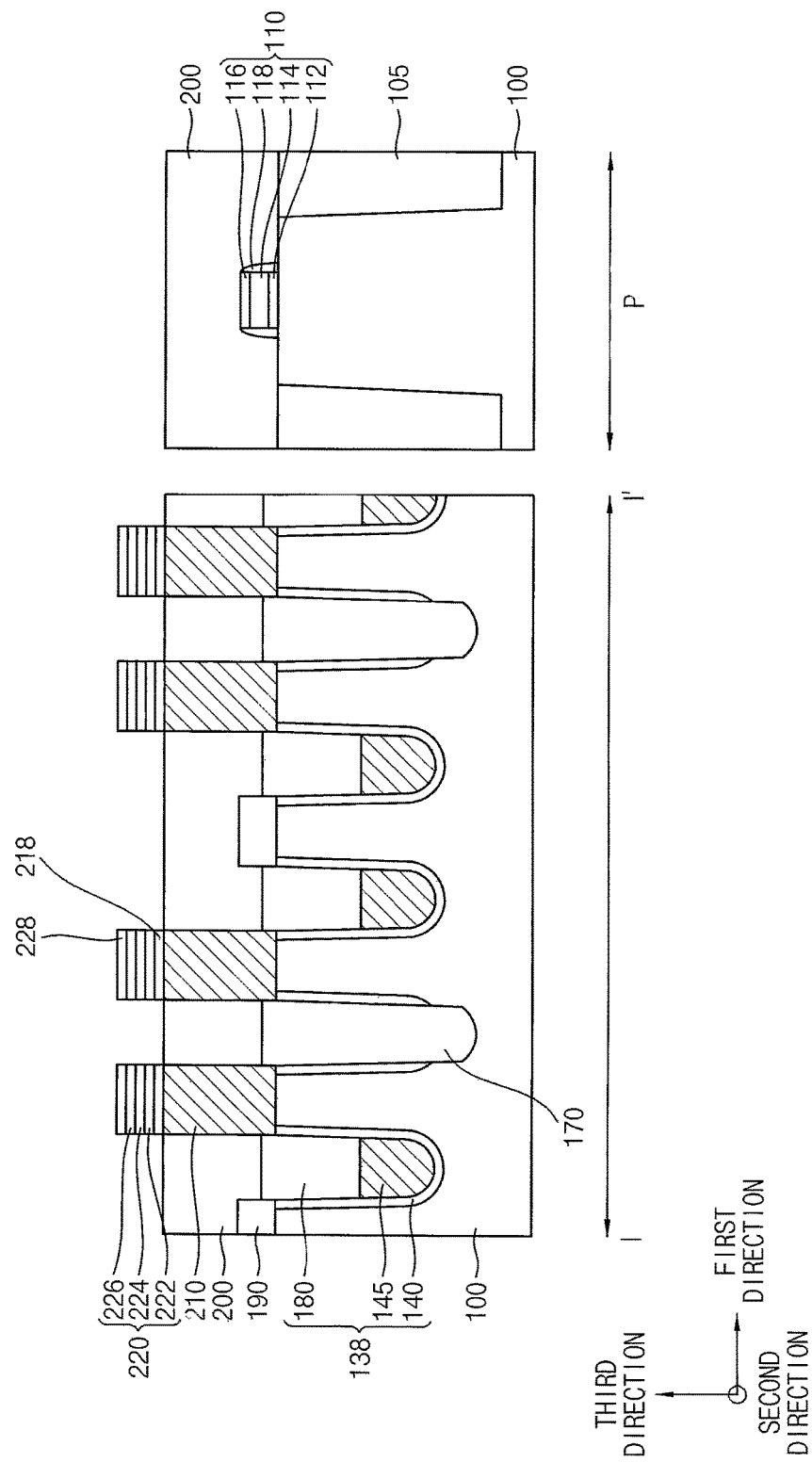

Referring to FIG. 31, a lower electrode 218, an MTJ structure 220, and an upper electrode 228 may be sequentially formed on the first contact 210.

The MTJ structure 220 may include a fixed layer 222, a tunnel barrier layer 224 and a free layer 226 sequentially formed.

In some example embodiments, the fixed layer 222 may include a magnetic material having a fixed magnetization direction. The free layer 226 may include a magnetic material having a magnetization direction that may be changed to be parallel or anti-parallel to the magnetization direction of the fixed layer 222. The tunnel barrier layer 224 may include at least one of magnesium oxide, titanium oxide, aluminum oxide, magnesium zinc oxide, and magnesium boron oxide. The lower electrode 218 and the upper electrode 228 may include a conductive metal nitride, e.g., titanium nitride, tantalum nitride, tungsten nitride, or the like.

In some example embodiments, pads (not shown) may be further formed between the lower electrode 218 and the first contact 210.

Figure 32:
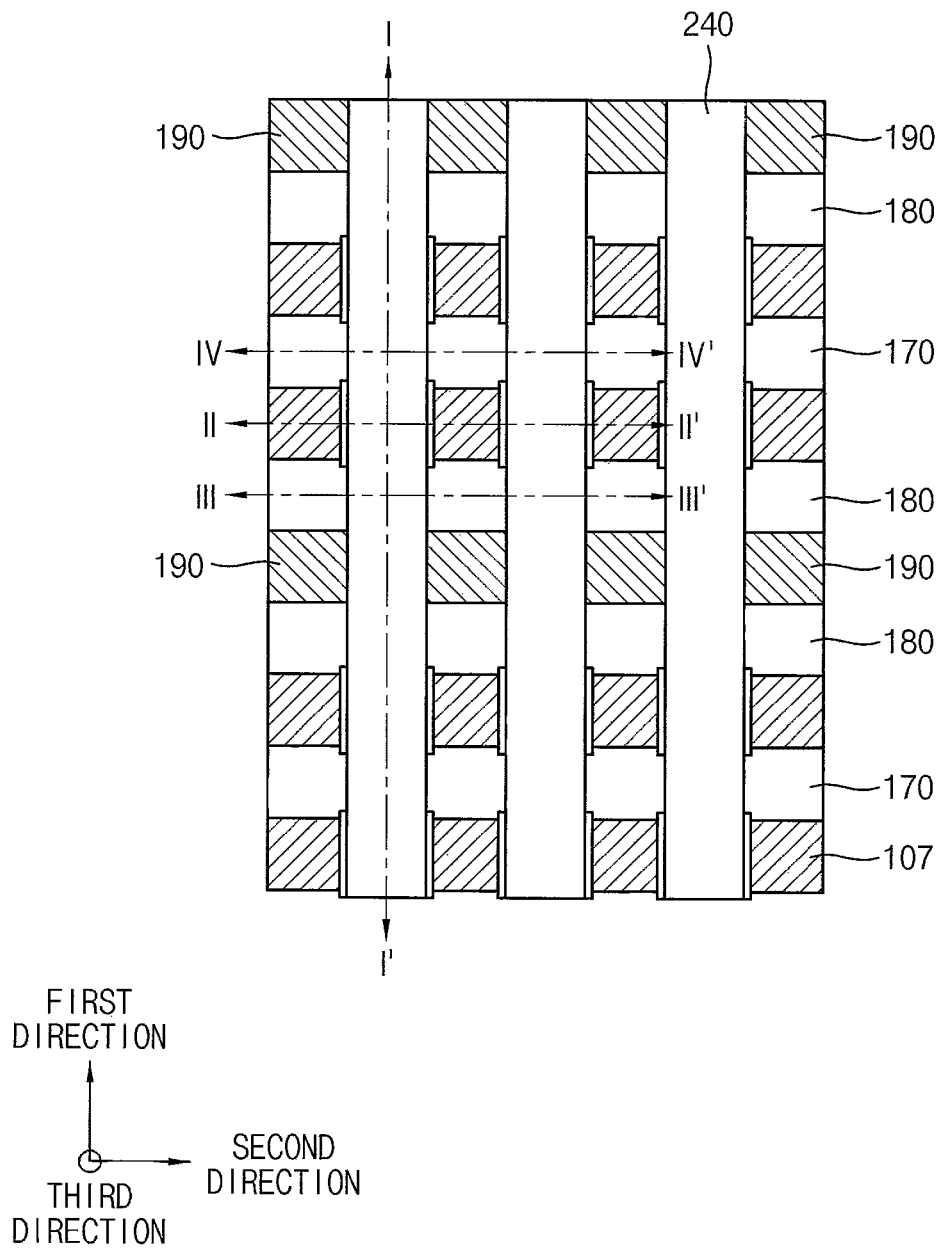
Figure 33:
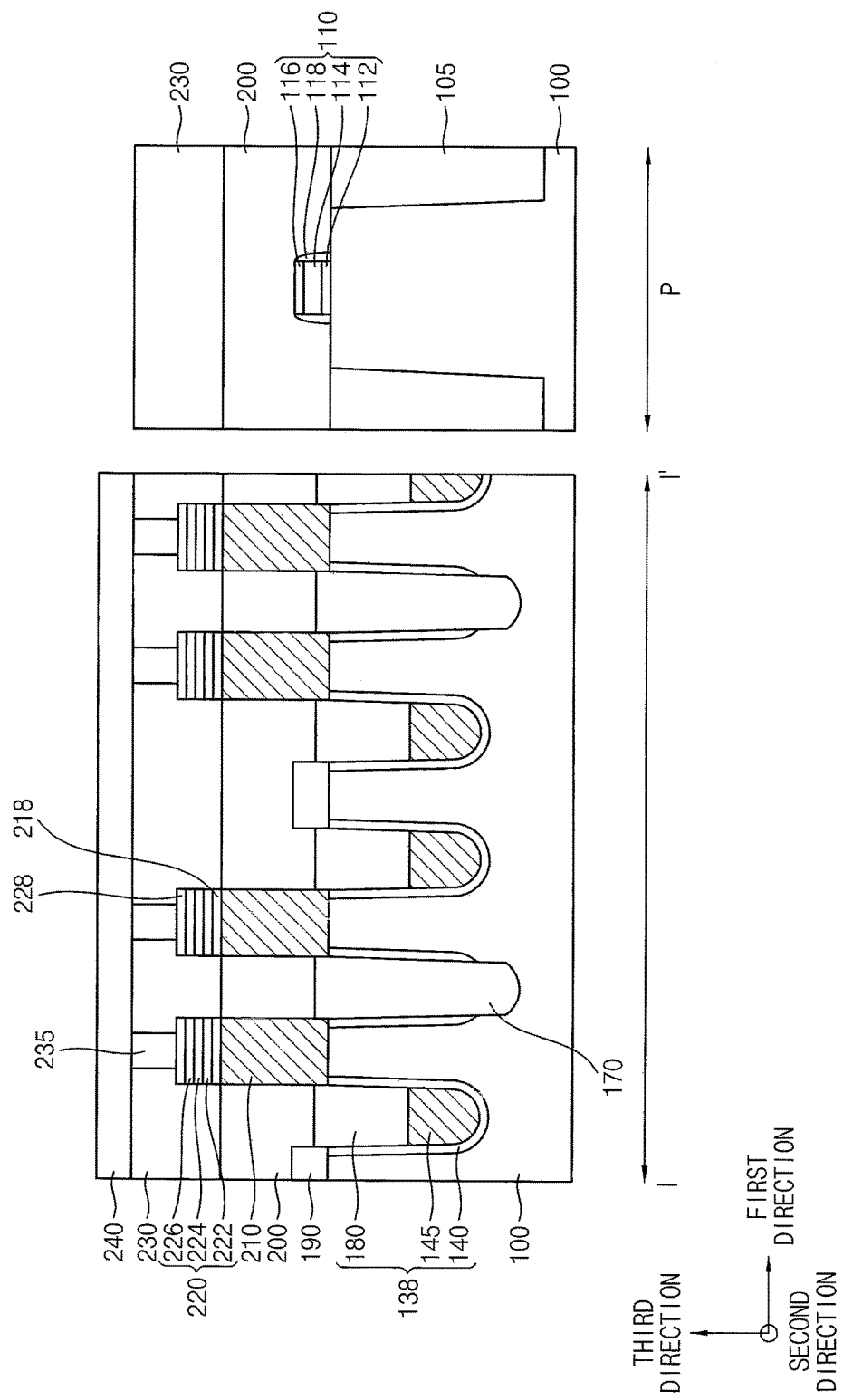
Figure 34:
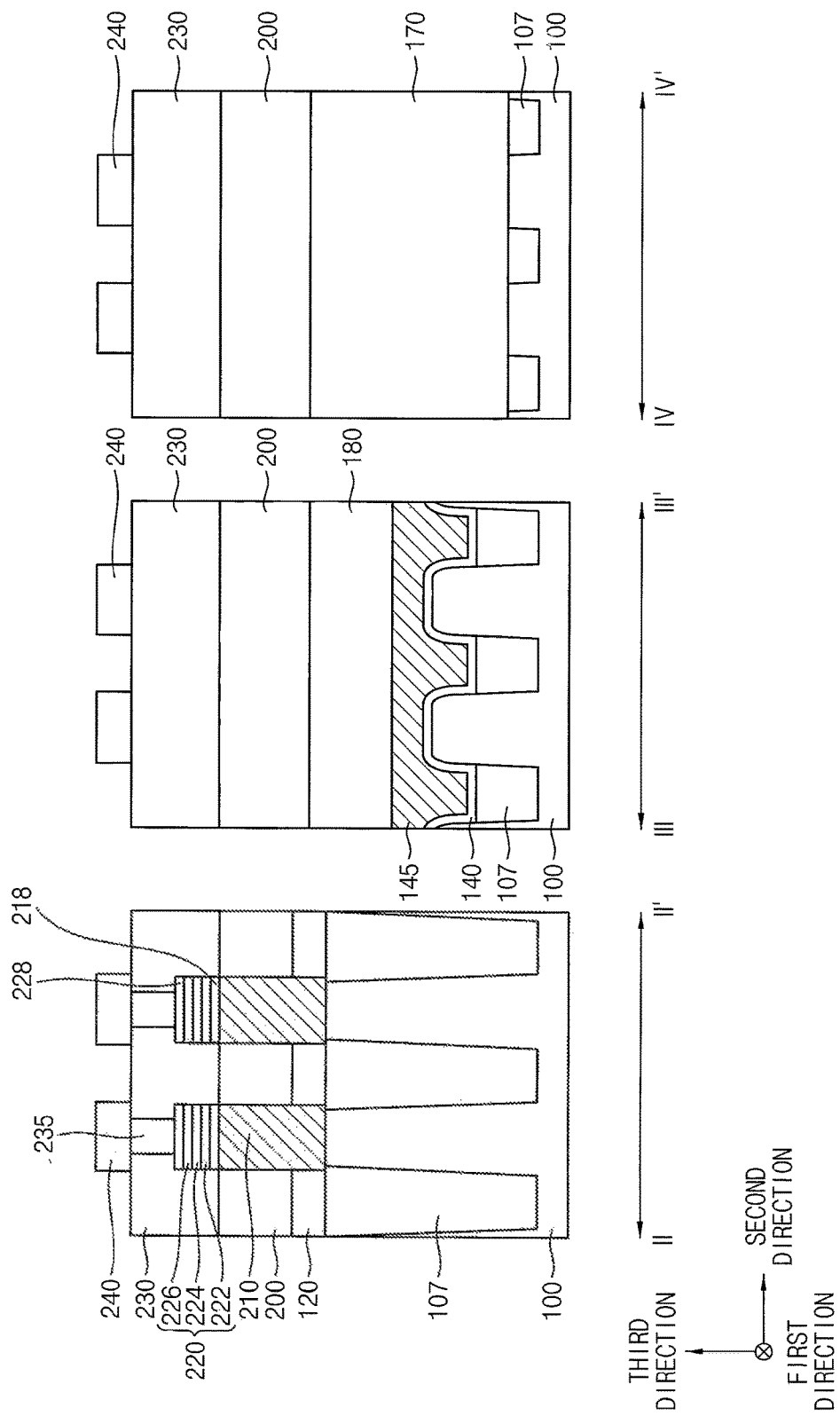

Referring to FIGS. 32 to 34, a second insulating interlayer 230 covering the MTJ structure 220 may be formed on the first insulating interlayer 200, and a bit line 240 may be formed on the second insulating interlayer 230.

Particularly, the second insulating interlayer 230 may be formed using, e.g., a silicon oxide. The second insulating interlayer 230 may be partially removed to form a contact hole (not shown) exposing the upper electrode 228. A second contact 235 may be formed to fill the contact hole, and the bit line may be formed on the second insulating interlayer 230 to be electrically connected to the second contact 235.

In some example embodiments, a plurality of bit lines 240 may be formed along the second direction. Each of the bit lines 240 may extend along the first direction.

Figure 35:
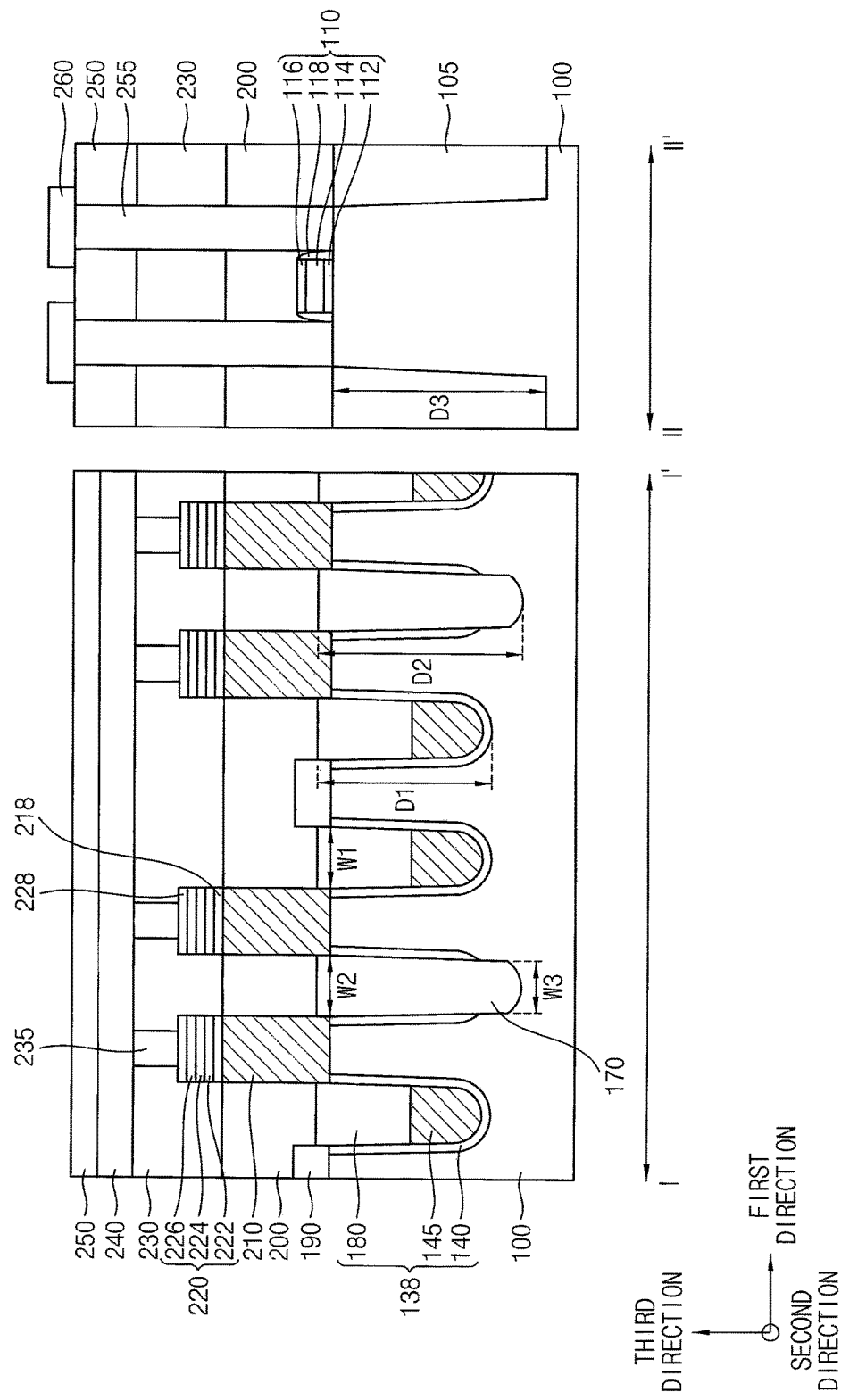

Referring to FIG. 35, a third insulating interlayer 250 may be formed on the second insulating interlayer 230, and wirings 260 may be formed on the third insulating interlayer 250.

The third insulating interlayer 250 covering the bit line 240 may be formed on the second insulating interlayer 230. A contact hole (not shown) may be formed through the first to third insulating interlayers 200, 230, and 250 in the peripheral region P. A third contact 255 may be formed to fill the contact hole, and the wirings 260 may be formed on the third insulating interlayer 250 to be electrically connected to the third contact 255.

In some example embodiments, the sacrificial gate electrode 145A may be replaced with the insulation layer pattern 170 having a depth greater than that of the sacrificial gate electrode 145A. For example, the insulation layer pattern 170 may apply a stress to the upper portion of the substrate 100 serving as a channel of the transistor. Accordingly, the mobility of electric charges in the channel of the transistor may be increased, and electrical characteristics of the transistor may be improved. Additionally, the insulation layer pattern 170 may electrically insulate the upper portions of the substrate 100, that is, the active patterns spaced apart from each other in the first direction.

In a comparative embodiment, a negative voltage may be applied to the sacrificial gate electrode 145A via an adjacent sacrificial gate electrode 145A in order to separate neighboring active patterns from each other. In this case, a leakage current may be generated in the transistor by the negative voltage. When the sacrificial gate electrode 145A is damaged, for example, when a portion of the sacrificial gate electrode 145A is broken, the negative voltage may not be applied to the sacrificial gate electrode 145A, and thus the active patterns may not be separated with each other.

In contrast, in example embodiments of the present inventive concepts, the insulation layer pattern 170 including an insulation material may be used, and thus no leakage current caused by the negative voltage may be generated.

FIGS. 36 to 39 are cross-sectional views illustrating steps of a method of manufacturing a semiconductor device. This method may be substantially the same as or similar to that illustrated with reference to FIGS. 8 to 35 except for the order of some stages. Thus, like reference numerals refer to like elements, and detailed descriptions thereon may be omitted below in the interest of brevity.

Figure 36:
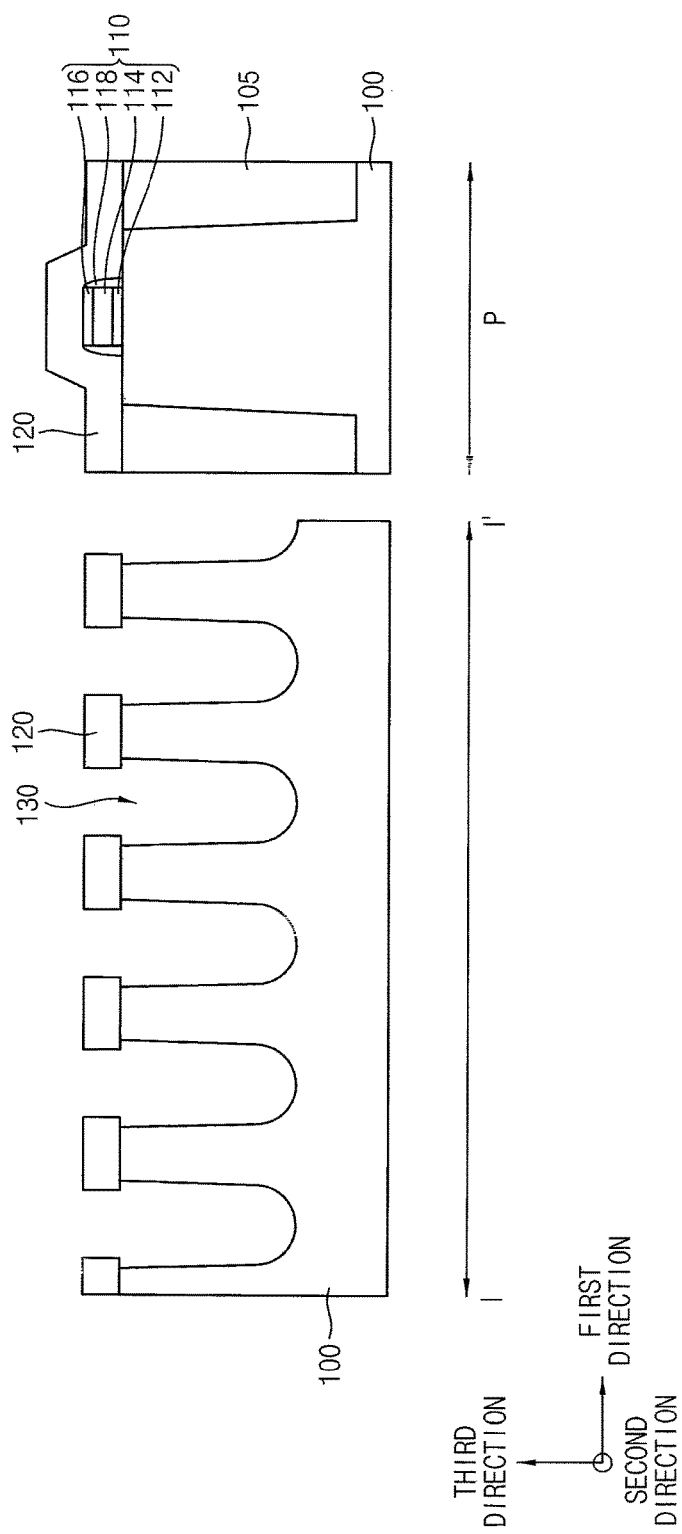

Referring to FIG. 36, processes substantially the same as or similar to those illustrated with reference to FIGS. 8 to 14 may be performed.

That is, first and second isolation layers 105 and 107 may be formed on a substrate 100 to define an active pattern. A peripheral gate structure 110 may be formed on the substrate 100 in a peripheral region P. A hard mask 120 may be formed. Upper portions of the substrate 100 and the second isolation layer 107 may be removed using the hard mask 120 as an etching mask to form a plurality of gate trenches 130.

Figure 37:
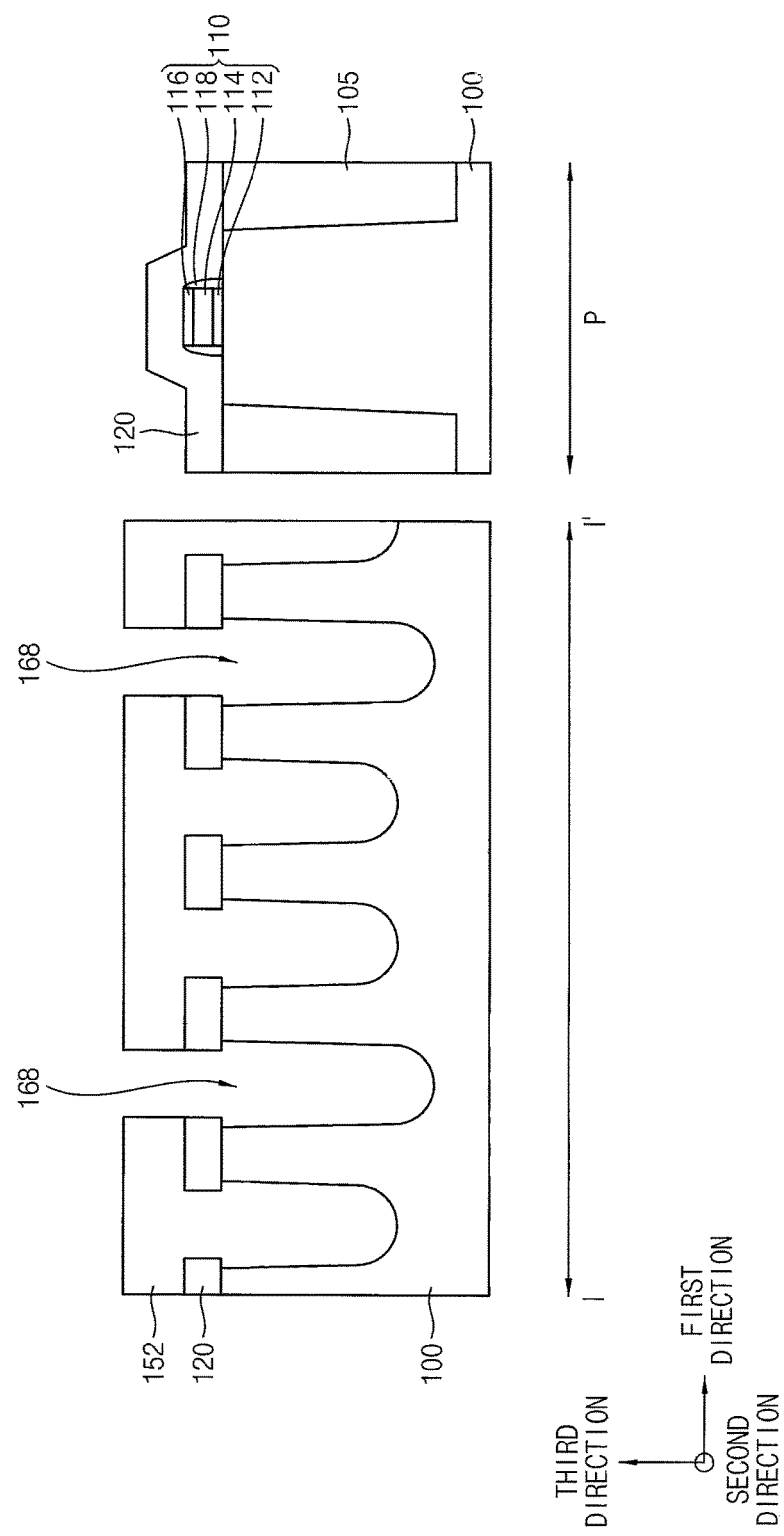

Referring to FIG. 37, a sacrificial layer 152 filling ones of the gate trenches 130 may be formed on the substrate 100 and the hard mask 120. A portion of the substrate 100 not covered by the sacrificial layer 152 may be removed to form a recess 168.

Particularly, the sacrificial layer 152 may be formed on the substrate 100 and the hard mask 120 to fill all of the gate trenches 130, and a portion of the sacrificial layer 152 may be removed to expose ones of the gate trenches 130.

A portion of the substrate 100 exposed by ones of the gate trenches 130 may be removed by one of the etching processes illustrated with reference to FIGS. 22A, 22B, and 22C to form the recess 168.

Figure 38:
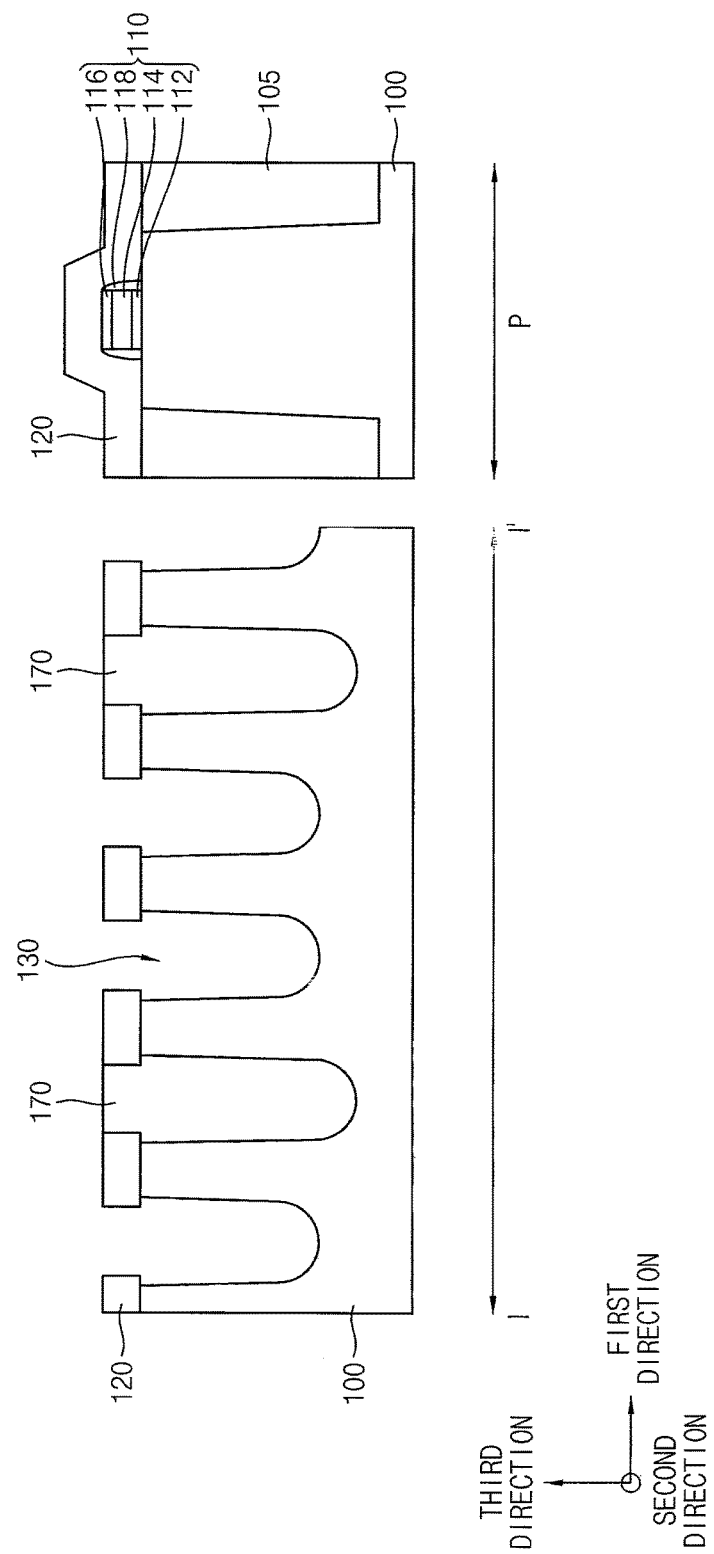
Figure 39:
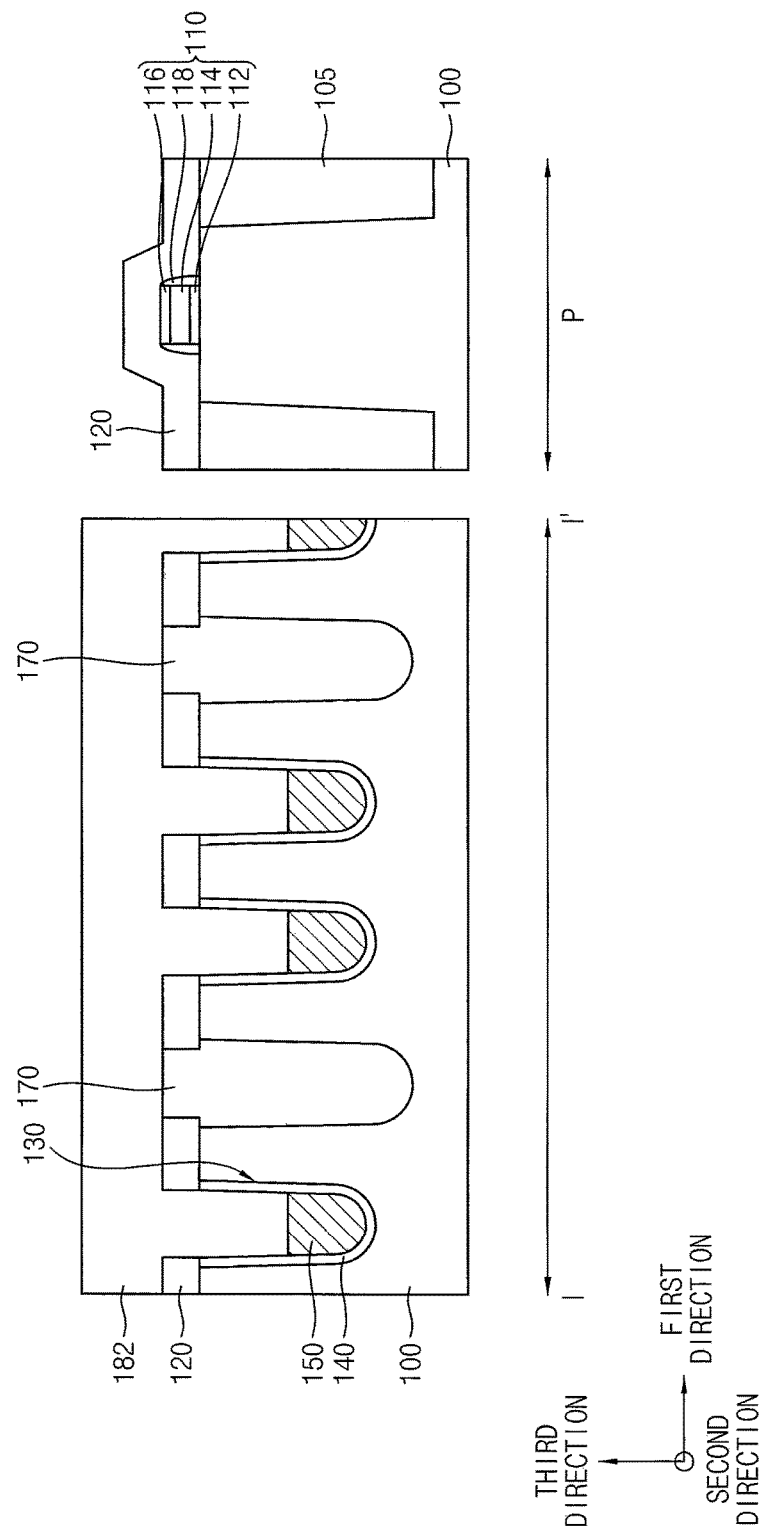

Referring to FIG. 38, an insulation layer pattern 170 filling the recess 186 may be formed.

Particularly, an insulation layer filling the recess 168 may be formed on the sacrificial layer 152, and an upper portion of the insulation layer may be removed by a planarization process or an etch-back process to form the insulation layer pattern 170.

A remaining sacrificial layer 152 may be removed so that ones of the gate trenches 130 may be exposed again.

Processes illustrated with reference to FIGS. 26 to 35 including the processes for forming the gate insulation layer and the gate electrode may be performed.

In some example embodiments, when compared to the processes illustrated with reference to FIGS. 8 to 35, the order of the process for forming the gate electrodes and the process for forming the recess may be interchanged.

Figure 40:
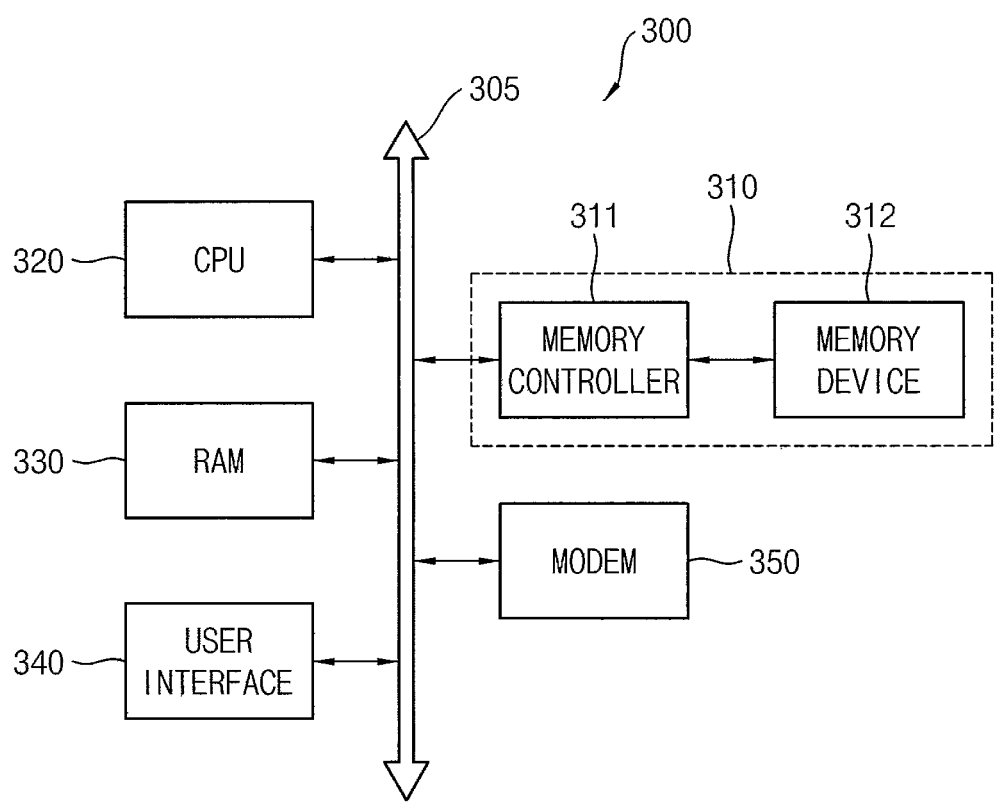

FIG. 40 is a block diagram illustrating a schematic configuration of an information processing system in accordance with some example embodiments.

Referring to FIG. 40, an information processing system 400 may include a central processing unit (CPU) 420 electrically connected to a system bus 405, a random access memory (RAM) 430, a user interface 440, a modem 450, e.g., a baseband chipset, and a memory system 410. The memory system 410 may include a memory device 412 and a memory controller 411. The memory device 412 may include an MRAM device in accordance with some example embodiments. Thus, the memory device 412 may reliably store data processed in the CPU 420 or high capacity data input from outside. The memory controller 411 may control the memory device 412. By combination of the memory device 412 and the memory controller 411, the memory system 410 may serve as, e.g., a memory card, a solid state disk (SSD), or the like. The memory device 412 and the memory controller 411 may be provided as a package-on-package (POP) form.

When the information processing system 400 is a mobile device, a battery for supplying an operating voltage of the information processing system 400 may be further provided. The information processing system 400 in accordance with some example embodiments may further include an application chipset, a CMOS image sensor (CIS), mobile DRAMs, and/or the like. The information processing system 400 may be used for a mobile phone, a MP3 player, various home appliances, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate having a cell region and a peripheral region;
   a first isolation layer buried in a first upper portion of the substrate, the first upper portion being in the peripheral region;
   a second isolation layer buried in a second upper portion of the substrate, the second upper portion being in the cell region, and the second isolation layer extending along a first direction substantially parallel to a top surface of the substrate;
   an insulation layer pattern buried in the second upper portion, the insulation layer pattern extending along a second direction, and the second direction being substantially parallel to the top surface of the substrate and substantially perpendicular to the first direction, the insulation layer pattern having a lower surface higher than a lower surface of the second isolation layer, and the insulation layer pattern applying a stress to a portion of the substrate adjacent thereto; and a gate structure on the substrate in the cell region;

wherein the gate structure extends along the second direction in the second upper portion, and the gate structure includes,
- a gate insulation layer on a bottom and a sidewall of a gate trench;
- a gate electrode on the gate insulation layer, the gate electrode filling a lower portion of the gate trench; and
- a gate mask on the gate electrode, the gate mask filling an upper portion of the gate trench; and wherein a width of a bottom portion of the insulation layer pattern is greater than a width of a top portion of the insulation layer pattern, and the width of the top portion of the insulation layer pattern is less than a width of a top of the gate trench.

2. A semiconductor device, comprising:

a substrate having a cell region and a peripheral region;

a first isolation layer buried in a first upper portion of the substrate, the first upper portion being in the peripheral region;

a second isolation layer buried in a second upper portion of the substrate, the second upper portion being in the cell region, and the second isolation layer extending along a first direction substantially parallel to a top surface of the substrate;

an insulation layer pattern buried in the second upper portion, the insulation layer pattern extending along a second direction, and the second direction being substantially parallel to the top surface of the substrate and substantially perpendicular to the first direction, the insulation layer pattern having a lower surface higher than a lower surface of the second isolation layer, and the insulation layer pattern applying a stress to a portion of the substrate adjacent thereto; and a gate structure on the substrate in the cell region;

wherein a width of a bottom portion of the insulation layer pattern is greater than a width of a top portion of the insulation layer pattern.

* * * * *